(12) United States Patent
Yamada

(10) Patent No.: US 8,310,317 B2
(45) Date of Patent: Nov. 13, 2012

(54) VIBRATING MEMBER, VIBRATING DEVICE, AND ELECTRONIC APPARATUS

(75) Inventor: Akinori Yamada, Ina (JP)

(73) Assignee: Seiko Epson Corporation, Tokyo (JP)

( * ) Notice: Subject to any disclaimer, the term of this patent is extended or adjusted under 35 U.S.C. 154(b) by 1 day.

(21) Appl. No.: 13/005,798

(22) Filed: Jan. 13, 2011

(65) Prior Publication Data

US 2011/0187470 A1 Aug. 4, 2011

(30) Foreign Application Priority Data

Feb. 2, 2010 (JP) ................................. 2010-020945

(51) Int. Cl.
*H03B 5/30* (2006.01)
(52) U.S. Cl. ......... 331/155; 331/154; 331/156; 310/367
(58) Field of Classification Search .................. 331/155, 331/156, 154, 107 A, 158; 310/348, 367, 310/370
See application file for complete search history.

(56) References Cited

U.S. PATENT DOCUMENTS

| | | | | |
|---|---|---|---|---|
| 6,065,339 A | * | 5/2000 | Takeuchi et al. | ........... 73/504.12 |
| 7,246,520 B2 | * | 7/2007 | Eguchi et al. | ............... 73/504.16 |
| 2006/0049724 A1 | * | 3/2006 | Eguchi | ........................ 310/367 |
| 2006/0082261 A1 | * | 4/2006 | Tanaya | .......................... 310/370 |
| 2008/0236281 A1 | * | 10/2008 | Noguchi et al. | ........... 73/504.16 |

FOREIGN PATENT DOCUMENTS

| | | |
|---|---|---|
| JP | A-2008-166903 | 7/2008 |
| JP | A-2008-228195 | 9/2008 |
| JP | A-2009-5022 | 1/2009 |
| JP | A-2010-171966 | 8/2010 |

* cited by examiner

*Primary Examiner* — Joseph Chang
*Assistant Examiner* — Jeffrey Shin
(74) *Attorney, Agent, or Firm* — Oliff & Berridge, PLC

(57) ABSTRACT

A vibrating member includes a base portion, a plurality of vibrating arms which extend from one end portion of the base portion, are provided in parallel in a first direction, and extend in a second direction perpendicular to the first direction, a linking portion which is provided between the base end portions of two adjacent vibrating arms and extends from the other end portion of the base portion, and a support portion which is connected to the base portion through the linking portion.

19 Claims, 15 Drawing Sheets

VIBRATING MEMBER, VIBRATING DEVICE, AND ELECTRONIC APPARATUS

BACKGROUND

1. Technical Field

The present invention relates to a vibrating member, a vibrating device, and an electronic apparatus.

2. Related Art

A vibrating device, such as a quartz oscillator, is known which includes a three-leg tuning-fork vibrating member having three vibrating arms (for example, see JP-A-2009-5022).

For example, the vibrating member described in JP-A-2009-5022 has a plate-shaped base portion, and three vibrating arms which extend from the base portion so as to be in parallel to each other. In this vibrating member, in a state where the end portion of the base portion opposite to the vibrating arms is fixed, the vibrating arms undergo bending vibration (out-of-plane bending vibration) in a direction perpendicular to the plate surface of the base portion. At this time, the base portion vibrates in its thickness direction with the bending vibration of the vibrating arms.

In the vibrating member described in JP-A-2009-5022, two adjacent vibrating arms undergo bending vibration in opposite directions. Thus, the vibration of the base portion can be cancelled between two adjacent vibrating arms.

However, in the vibrating member described in JP-A-2009-5022, there is a problem (vibration leakage) in that vibration occurring around the connection portion of the base portion and each vibrating arm is transmitted to the fixed portion of the base portion and leaks. For this reason, in the related art, it is impossible to sufficiently increase the Q value of the vibrating member.

SUMMARY

An advantage of some aspects of the invention is that it provides an out-of-plane bending vibration type vibrating member capable of preventing vibration leakage and increasing the Q value, and a vibrating device.

The invention can be implemented by the following forms or application examples.

APPLICATION EXAMPLE 1

This application example of the invention provides a vibrating member. The vibrating member includes a base portion, a plurality of vibrating arms which extend from one end portion of the base portion, are provided in parallel in a first direction, and extend in a second direction perpendicular to the first direction, a linking portion which is provided between the base end portions of two adjacent vibrating arms and extends from the other end portion of the base portion, and a support portion which is connected to the base portion through the linking portion.

Therefore, it is possible to prevent or suppress transmission of vibration (leakage vibration) of the base portion associated with the bending vibration (out-of-plane bending vibration) of the vibrating arms to the support portions. As a result, it is possible to prevent vibration leakage and increase the Q value.

APPLICATION EXAMPLE 2

In the vibrating member according to the application example of the invention, at least three vibrating arms may be provided such that two adjacent vibration arms undergo bending vibration in opposite directions.

Therefore, it is possible to reduce leakage vibration in a region corresponding to a position where no vibration arm is present in the first direction of the base portion.

APPLICATION EXAMPLE 3

In the vibrating member according to the application example of the invention, one of a through hole, a groove portion, and a cutout may be formed between the base portion and the support portion to correspond to a position in the first direction where each vibrating arm is present.

Therefore, it is possible to prevent transmission of vibration of the base portion associated with the bending vibration of the vibrating arms to the support portion.

APPLICATION EXAMPLE 4

In the vibrating member according to the application example of the invention, the linking portion may include a plurality of linking beams, one end portions of which are connected to the base portion and the other end portions of which are connected to the support portion.

Therefore, it is possible to suppress vibration leakage and to allow the support portion to stably support a plurality of vibrating arms and the base portion through the linking portion.

APPLICATION EXAMPLE 5

In the vibrating member according to the application example of the invention, when the width in the first direction of each connection portion of the linking portion and the base portion is W1 and the distance between two adjacent vibrating arms is L1, the relationship $0.5 \leq W1/L1 \leq 0.8$ may be satisfied.

Therefore, it is possible to reliably prevent or suppress transmission of vibration of the base portion associated with the bending vibration of the vibrating arms to the support portion.

APPLICATION EXAMPLE 6

In the vibrating member according to the application example of the invention, when the thickness of the linking portion in the third direction is D1, the relationship $0.5 \leq W1/D1 \leq 2$ may be satisfied.

Therefore, even when the width W1 is narrowed, it is possible to prevent vibration leakage and to allow the support portion to stably support a plurality of vibrating arms and the base portion through the linking portion.

APPLICATION EXAMPLE 7

In the vibrating member according to the application example of the invention, when the length of the linking portion in the second direction is L2, the relationship $0.5 \leq W1/L2 \leq 2$ may be satisfied.

Therefore, even when the width W1 is narrowed, it is possible to prevent vibration leakage and to allow the support portion to stably support a plurality of vibrating arms and the base portion through the linking portion.

APPLICATION EXAMPLE 8

In the vibrating member according to the application example of the invention, when the width of the base portion in the second direction is W2, the relationship $0.5 \leq W1/W2 \leq 2$ may be satisfied.

Therefore, it is possible to prevent transmission of vibration of the base portion associated with the bending vibration of the vibrating arms to the linking portion.

APPLICATION EXAMPLE 9

In the vibrating member according to the application example of the invention, a mass portion having a cross-sectional area greater than that of the base end portion may be provided at the tip portion of each vibrating arm.

Therefore, it is possible to prevent elongation of each vibrating arm and to lower the frequency of the bending vibration of each vibrating arm. When the mass portion is provided in each vibrating arm, the tip portion of each vibrating arm becomes heavier, such that vibration of the base portion associated with the bending vibration of each vibrating arm increases. For this reason, the effect with the application of the invention becomes noticeable.

APPLICATION EXAMPLE 10

In the vibrating member according to the application example of the invention, the vibrating arms may be formed of a piezoelectric material.

Therefore, with a comparatively simple configuration in which a pair of excitation electrodes are provided on each vibrating arm, the vibrating arm can be vibrated (excited). In particular, if quartz is used as a piezoelectric material, excellent vibration characteristics of the vibrating member can be achieved.

APPLICATION EXAMPLE 11

In the vibrating member according to the application example of the invention, a piezoelectric element may be provided on each vibrating arm, the piezoelectric element including a pair of electrode layers and a piezoelectric layer interposed between the pair of electrode layers.

Therefore, each vibrating arm can be vibrated through electrical conduction to the corresponding piezoelectric element.

APPLICATION EXAMPLE 12

This application example of the invention provides a vibrating device. The vibrating device includes the above-described vibrating member, and a package in which the vibrating member is accommodated.

Therefore, it is possible to provide a vibrating device having excellent reliability.

APPLICATION EXAMPLE 13

The vibrating device may further include a circuit section which drives the above-described vibrating member.

Therefore, it is possible to provide a vibrating device having excellent reliability. The vibrating device has the vibrating member and the circuit section having a function of oscillating the vibrating member, making it possible to provide a smaller vibrating device.

APPLICATION EXAMPLE 14

This application example of the invention provides an electronic apparatus. The electronic apparatus includes the above-described vibrating member or vibrating device, and a circuit section which drives the vibrating member.

The electronic apparatus according to this application example of the invention uses a stable and high-precision vibrating member or vibrating device capable of preventing vibration leakage and increasing the Q value with small variations between the vibrating member elements, making it possible to achieve stable characteristics and reduction in size.

BRIEF DESCRIPTION OF THE DRAWINGS

The invention will be described with reference to the accompanying drawings, wherein like numbers reference like elements.

FIG. 13A is a top view and FIG. 13B is a front sectional view of FIG. 13A.

DESCRIPTION OF EXEMPLARY EMBODIMENTS

Hereinafter, a vibrating member and a vibrating device according to the invention will be described in detail on the basis of the embodiments shown in the accompanying drawings.

First Embodiment

Figure 1:
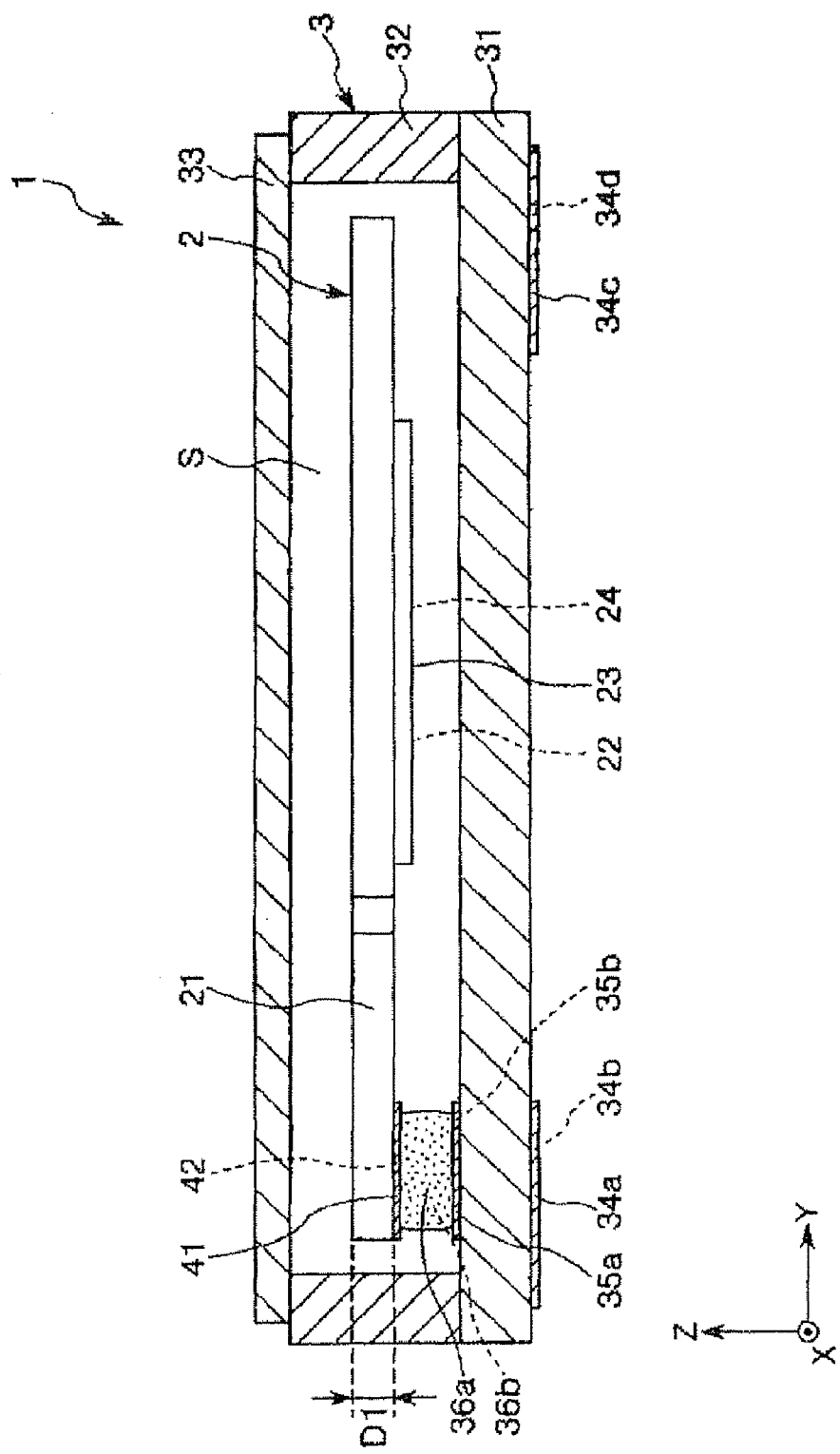
FIG. 1 is a sectional view showing a vibrating device according to a first embodiment of the invention.
Figure 2:
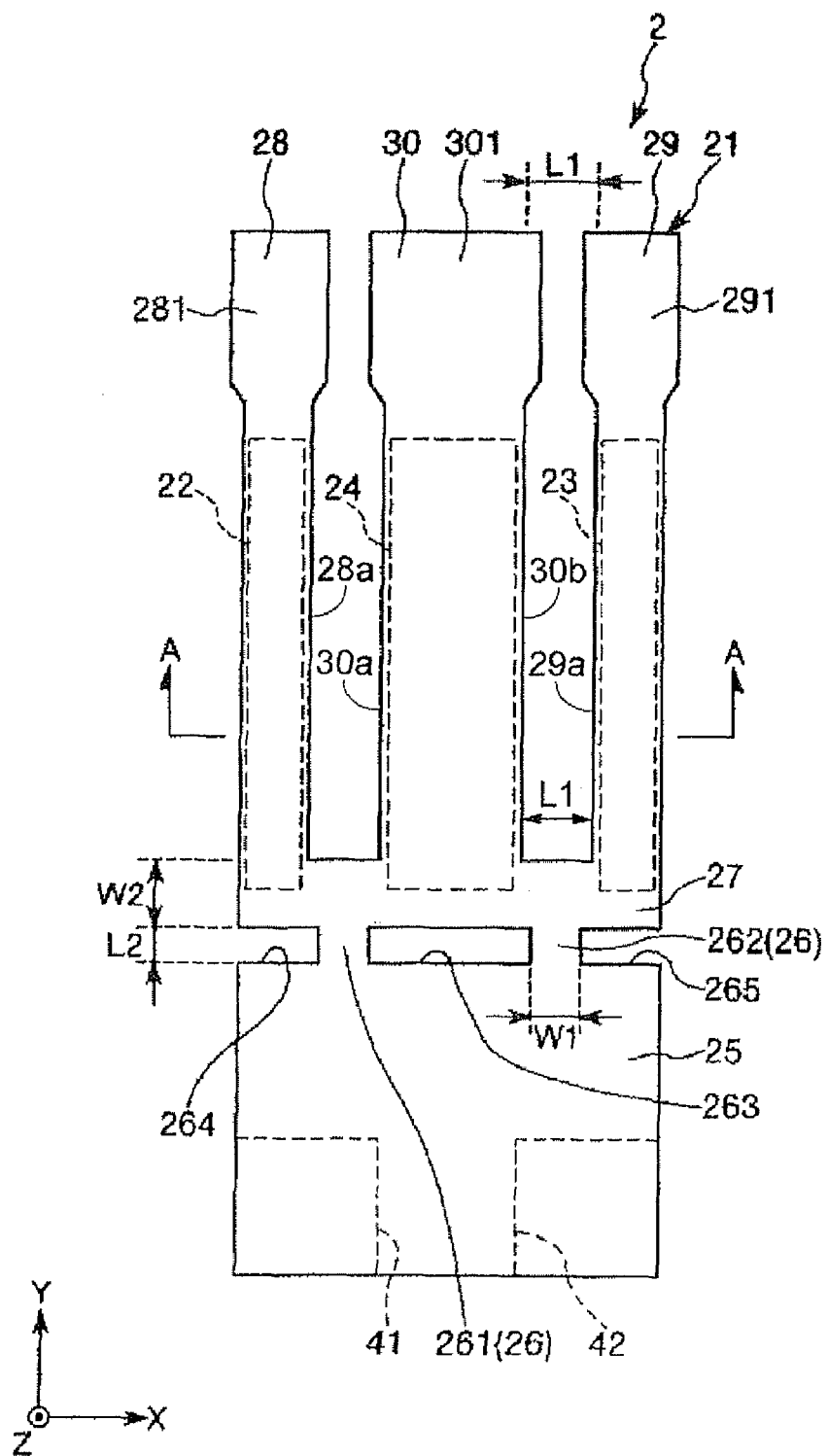
FIG. 2 is a top view showing a vibrating member in the vibrating device shown in FIG. 1.
Figure 3:
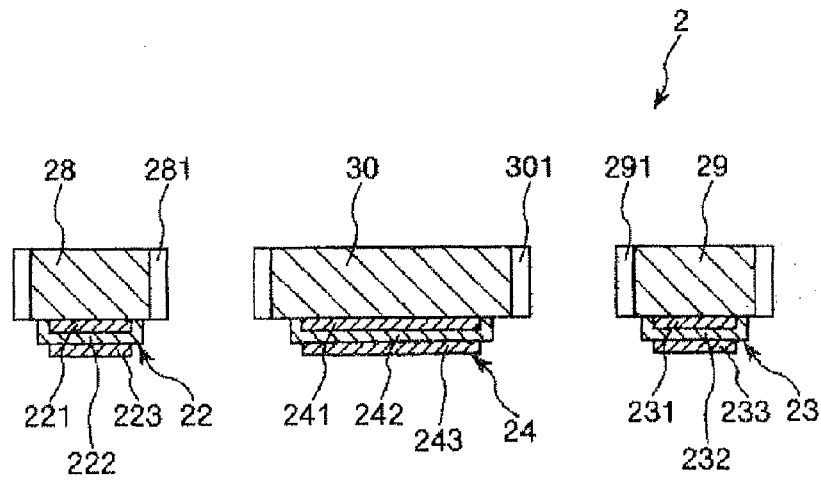
FIG. 3 is a sectional view taken along the line A-A of FIG. 2.
Figure 4:
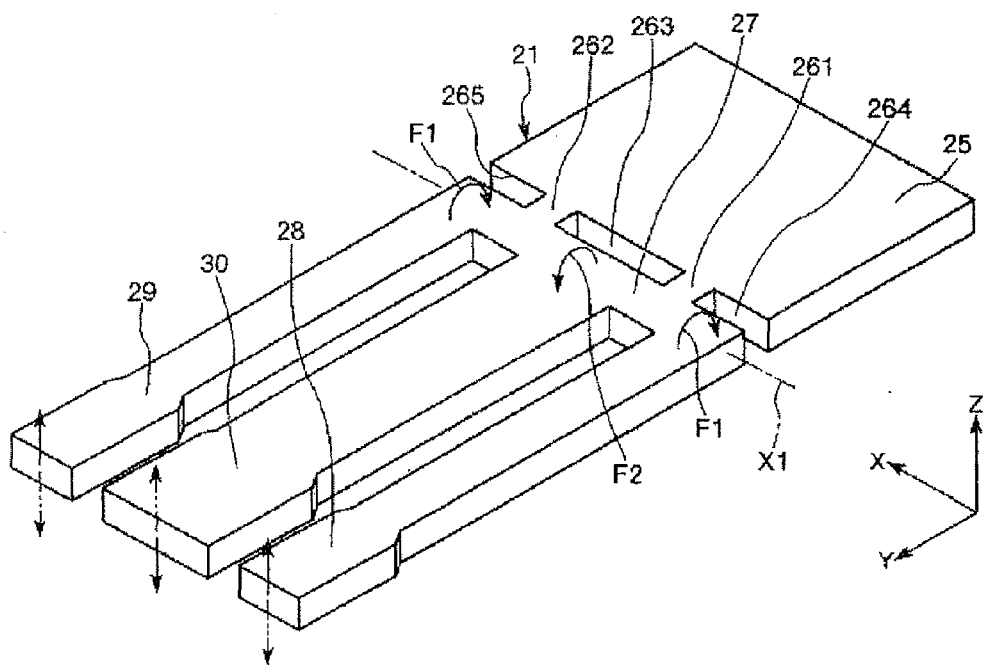
FIG. 4 is a perspective view illustrating the operation of the vibrating member shown in FIG. 2.

FIG. 1 is a sectional view showing a vibrating device according to a first embodiment of the invention. FIG. 2 is a top view showing a vibrating member in the vibrating device shown in FIG. 1. FIG. 3 is a sectional view taken along the line A-A of FIG. 2. FIG. 4 is a perspective view illustrating the operation of the vibrating member shown in FIG. 2. In the drawings, for convenience of description, the X axis, the Y axis, and the Z axis are shown as three axes perpendicular to each other. In the following description, the direction (first direction) parallel to the X axis is referred to as "X-axis direction", the direction (second direction) parallel to the Y axis is referred to as "Y-axis direction", and the direction (third direction) parallel to the Z axis is referred to as "Z-axis direction". In the following description, for convenience of description, the upper side of FIG. 1 is referred to as "up", the lower side is referred to as "down", the right side is referred to as "right", and the left side is referred to as "left".

A vibrating device 1 shown in FIG. 1 has a vibrating member 2, and a package 3 in which the vibrating member 2 is accommodated.

Hereinafter, the respective sections constituting the vibrating device 1 will be sequentially described in detail.

Vibrating Member

First, the vibrating member 2 will be described.

The vibrating member 2 is a three-leg tuning-fork vibrating member shown in FIG. 2. The vibrating member 2 has a vibrating substrate 21, and piezoelectric elements 22, 23, and 24 and connection electrodes 41 and 42 provided on the vibrating substrate 21.

The vibrating substrate 21 has a support portion 25, a linking portion 26, a base portion 27, and three vibrating arms 28, 29, and 30.

The material for the vibrating substrate 21 is not particularly limited insofar as the desired vibration characteristics can be exhibited, and various piezoelectric materials and various non-piezoelectric materials may be used.

Examples of the piezoelectric materials include quartz, lithium tantalate, lithium niobate, lithium borate, barium titanate, and the like. In particular, quartz is preferably used as the piezoelectric material for the vibrating substrate 21. If the vibrating substrate 21 is formed of quartz, excellent vibration characteristics of the vibrating substrate 21 related to the temperature dependency of frequency can be achieved. The vibrating substrate 21 can be formed through etching with high dimensional precision. When the vibrating substrate 21 (vibrating arms 28, 29, and 30) are formed of such piezoelectric materials, the vibrating arms 28, 29, and 30 can be vibrated with a comparatively simple configuration in which electrodes (excitation electrodes) are formed, instead of the piezoelectric elements 22, 23, and 24.

Examples of the non-piezoelectric materials include silicon and the like. In particular, silicon is preferably used as the non-piezoelectric material for the vibrating substrate 21. If the vibrating substrate 21 is formed of silicon, excellent vibration characteristics of the vibrating substrate 21 can be achieved at low cost. The vibrating substrate 21 can be formed through etching with high dimensional precision.

In the vibrating substrate 21, the base portion 27 extends in the X-axis direction (first direction) and has a longitudinal shape (strip shape).

The three vibrating arms 28, 29, and 30 are connected to one end of the base portion 27 in the width direction.

The vibrating arms 28 and 29 are connected to both end portions of the base portion 27 in the longitudinal direction, and the vibrating arm 30 is connected to the central portion of the base portion 27 in the longitudinal direction.

The three vibrating arms 28, 29, and 30 are provided to extend from the base portion 27 to be in parallel to each other. In other words, the three vibrating arms 28, 29, and 30 are provided to extend from the base portion 27 in the Y-axis direction and to be in parallel in the X-axis direction.

The vibrating arms 28, 29, and 30 have a longitudinal shape. The end portion (base end portion) of each vibrating arm on the base portion 27 side becomes a fixed end, and the end portion (tip portion) opposite to the base portion 27 becomes a free end.

The vibrating arms 28 and 29 are formed to have the same width, and the vibrating arm 30 is formed to have a width two times greater than the width of each of the vibrating arms 28 and 29. Thus, when the vibrating arms 28 and 29 undergo bending vibration in the Z-axis direction, and the vibrating arm 30 undergoes bending vibration in the Z-axis direction in an opposite direction (reversed phase) to the vibrating arms 28 and 29, it is possible to reduce vibration leakage.

At the tip portion of the vibrating arm 28, a mass portion (hammer head) 281 is provided to have a cross-sectional area greater than that of the base end portion (the portion of the vibrating arm 28 on the base portion 27 side). Similarly, at the tip portion of the vibrating arm 29, a mass portion (hammer head) 291 is provided to have a cross-sectional area greater than that of the base end portion (the portion of the vibrating arm 29 on the base portion 27 side). At the tip portion of the vibrating arm 30, a mass portion (hammer head) 301 is provided to have a cross-sectional area greater than that of the base end portion (the portion of the vibrating arm on the base portion 27 side). Thus, the vibrating member 2 can be further reduced in size and the frequency of the bending vibration of the vibrating arms 28, 29, and 30 can be further lowered. That is, in general, the shorter the length of each of the vibrating arms 28, 29, and 30 in the longitudinal direction is, the higher the frequency of the bending vibration of each of the vibrating arms 28, 29, and 30, and the greater the mass of the tip portion of each of the vibrating arms 28, 29, and 30 is, the lower the frequency of the bending vibration of each of the vibrating arms 28, 29, and 30. Thus, if the mass of the tip portion of each of the vibrating arms 28, 29, and 30 increases, it is possible to set the frequency of the bending vibration of each of the vibrating arms 28, 29, and 30 low. If the length of each of the vibrating arms 28, 29, and 30 is short, it is possible to reduce the size of the vibrating member 2 while securing the value of a desired frequency.

The mass portions 281, 291, and 301 may be provided or may not be provided as necessary.

The piezoelectric element 22 is provided on the vibrating arm 28, the piezoelectric element 23 is provided on the vibrating arm 29, and the piezoelectric element 24 is provided on the vibrating arm 30.

The piezoelectric element 22 has a function of causing bending vibration of the vibrating arm 28 in the Z-axis direction through electrical conduction. The piezoelectric element 23 has a function of causing bending vibration of the vibrating arm 29 in the Z-axis direction through electrical conduction. The piezoelectric element 24 has a function of causing bending vibration of the vibrating arm 30 in the Z-axis direction through electrical conduction.

As shown in FIG. 3, the piezoelectric element 22 is formed by laminating a first electrode layer 221, a piezoelectric layer (piezoelectric thin-film) 222, and a second electrode layer 223 on the vibrating arm 28 in that order.

Thus, if a voltage is applied between the first electrode layer 221 and the second electrode layer 223, an electric field is generated in the piezoelectric layer 222 in the Z-axis direction. With this electric field, the piezoelectric layer 222 expands or contracts in the Y-axis direction to cause bending vibration of the vibrating arm 28 in the Z-axis direction.

Similarly, the piezoelectric element 23 is formed by laminating a first electrode layer 231, a piezoelectric layer (piezoelectric thin-film) 232, and a second electrode layer 233 on the vibrating arm 29 in that order. The piezoelectric element 24 is formed by laminating a first electrode layer 241, a piezoelectric layer (piezoelectric thin-film) 242, and a second electrode layer 243 on the vibrating arm 30 in that order.

Thus, if a voltage is applied between the first electrode layer 231 and the second electrode layer 233, the piezoelectric layer 232 expands or contracts in the Y-axis direction to cause bending vibration of the vibrating arm 29 in the Z-axis direction. If a voltage is applied between the first electrode layer 241 and the second electrode layer 243, the piezoelectric layer 242 expands or contracts in the Y-axis direction to cause bending vibration of the vibrating arm 30 in the Z-axis direction.

The first electrode layers 221, 231, and 241 and the second electrode layers 223, 233, and 243 may be formed of a metal material having excellent conductivity, such as gold, gold alloy, aluminum, aluminum alloy, silver, silver alloy, chromium, or chromium alloy.

As the electrode forming method, a physical film formation method, such as a sputtering method or a vacuum vapor deposition method, a chemical vapor deposition method, such as CVD, various coating methods, such as an ink jet method, or the like may be used.

Examples of the material (piezoelectric material) for the piezoelectric layers 222, 232, and 242 include ZnO (zinc oxide), AlN (aluminum nitride), PZT (lead zirconate titanate), and the like.

Meanwhile, the support portion 25 is connected to the other end of the base portion 27 in the width direction through the linking portion 26.

The support portion 25 is provided on the opposite side of the vibrating arms 28, 29, and 30 with respect to the base portion 27, and supports the base portion 27 and the three vibrating arms 28, 29, and 30 described above.

A pair of connection electrodes 41 and 42 are provided on the lower surface of the support portion 25.

The connection electrode 41 is electrically connected to the first electrode layer 221 and 231 and the second electrode layer 243 described above through wiring lines (not shown). The connection electrode 42 is electrically connected to the first electrode layer 241 and the second electrode layers 223 and 233 through wiring lines (not shown). Although in this example, an example has been described where a pair of connection electrodes 41 and 42 are provided on the lower surface of the support portion 25, the invention is not limited thereto. A pair of connection electrodes 41 and 42 may be provided on the upper surface of the support portion or may be provided on both the upper and lower surfaces of the support portion 25.

Thus, if a voltage is applied between the connection electrode 41 and the connection electrode 42, a voltage in the Z-axis direction is applied to the piezoelectric layers 222, 232, and 242 such that the first electrode layers 221 and 231 and the second electrode layer 243 have a polarity reverse to the first electrode layer 241 and the second electrode layers 223 and 233. When this happens, with the inverse piezoelectric effect of the piezoelectric material, the vibrating arms 28, 29, and 30 can undergo bending vibration at a given frequency (resonance frequency). At this time, as shown in FIG. 4, the vibrating arms 28 and 29 undergo bending vibration in the same direction, and the vibrating arm 30 undergoes bending vibration in an opposite direction to the vibrating arms 28 and 29.

the vibrating arms 28, 29, and 30 undergo bending vibration, a voltage is generated between the connection electrodes 41 and 42 at a given frequency because of the piezoelectric effect of the piezoelectric material. With the use of these natures, the vibrating member 2 can generate an electrical signal which vibrates at the resonance frequency.

Although in this embodiment, an example has been described where the polarization directions or crystal axis directions of the piezoelectric materials of the piezoelectric layers 222, 232, and 242 are the same, the invention is not limited thereto. For example, a voltage may be applied such that the polarization direction or crystal axis direction of the piezoelectric layer 242 is reverse to those of the piezoelectric layers 222 and 232, and the first electrode layers 221, 231, and 241 (the second electrode layers 223, 233, and 243) have the same polarity.

The connection electrodes 41 and 42 and the wiring lines (not shown) may be formed of a metal material having excellent conductivity, such as gold, gold alloy, aluminum, aluminum alloy, silver, silver alloy, chromium, or chromium alloy.

As the method of forming the electrodes and the like, a physical film formation method, such as a sputtering method or a vacuum vapor deposition method, a chemical vapor deposition method, such as CVD, various coating methods, such as an ink jet method, or the like may be used.

The linking portion 26 is connected to the support portion 25.

The linking portion 26 connects the base portion 27 and the support portion 25. In particular, the end portion of the linking portion 26 on the base portion 27 side is connected to a region corresponding to a position where each of the vibrating arms 28, 29, and 30 is absent in the X-axis direction (first direction) of the base portion 27. Thus, it is possible to prevent or suppress transmission of vibration (hereinafter, referred to as "leakage vibration") of the base portion 27 associated with the bending vibration (out-of-plane bending vibration) of the vibrating arms 28, 29, and 30 to the support portion 25. As a result, it is possible to prevent vibration leakage and to increase the Q value.

Specifically, the linking portion 26 includes two linking beams 261 and 262.

In each of the linking beams 261 and 262, one end portion is connected to the base portion 27 and the other end portion is connected to the support portion 25.

In particular, the one end portion of the linking beam 261 is connected to a corresponding portion in the X-axis direction (longitudinal direction) of the base portion 27 between the vibrating arm 28 and the vibrating arm 30. The one end portion of the linking beam 262 is connected to a corresponding portion in the X-axis direction (longitudinal direction) of the base portion 27 between the vibrating arm 29 and the vibrating arm 30. In other words, in the base end portion, the end portion of the linking beam 261 on the base portion 27 side is formed to fall within a virtual area when the interval between a lateral surface 28a of the vibrating arm 28 and a lateral surface 30a of the vibrating arm 30 arranged to be opposite each other is extended in the Y direction. Similarly, in the base end portion, the end portion of the linking beam 262 on the base portion 27 side is formed to fall within a virtual area when the interval (the interval L1 shown in the drawing) between a lateral surface 29a of the vibrating arm 29 and a lateral surface 30b of the vibrating arm 30 arranged to be opposite each other is extended in the −Y direction. The connection portions of the linking beams 261 and 262 and the base portion 27 constitute the connection portions of the linking portion 26 and the base portion 27.

In this embodiment, the two linking beams 261 and 262 are provided in the Y-axis direction to be in parallel to each other. The linking beams 261 and 262 have a uniform width over the entire region in the longitudinal direction (Y-axis direction).

The width W1 of each connection portion of the linking portion 26 and the base portion 27 in the X-axis direction is smaller than the distance L1 between two adjacent vibrating arms 28 and 30 (between the vibrating arms 29 and 30). In other words, the width of each of the linking beams 261 and 262 is smaller than the distance L1. The width W1 of each connection portion of the linking portion 26 and the base portion 27 in the X-axis direction may be equal to the distance L1 between two adjacent vibrating arms 28 and 30 (vibrating arms 29 and 30) depending on the cross-sectional shape or length of each of the linking beams 261 and 262.

A through hole 263 in the Z-axis direction is formed between the two linking beams 261 and 262 (in an area surrounded by the support portion 25, the two linking beams 261 and 262, and the base portion 27).

A through cutout 264 in the Z-axis direction is formed on the opposite side of the hole 263 with respect to the linking beam 261, and a through cutout 265 in the Z-axis direction is formed on the opposite side of the hole 263 with respect to the linking beam 262.

The hole 263 and the cutouts 264 and 265 have a function of inhibiting vibration (leakage vibration) of the base portion 27 from being transmitted to the support portion 25.

The hole 263 and the cutouts 264 and 265 may not pass through in the Z-axis direction. That is, instead of the hole 263 and the cutouts 264 and 265, groove portions (for example, a concave groove portion) may be provided on one or both sides of the vibrating substrate 21.

Here, the occurrence of leakage vibration in the vibrating member 2 and a leakage prevention mechanism will be described in detail.

As described above, the vibrating arms 28 and 29 undergo bending vibration in the same direction, and the vibrating arm 30 undergoes bending vibration in the opposite direction to the vibrating arms 28 and 29 (see FIG. 4). That is, the state where the vibrating arms 28, 29, and 30 are bent in a direction indicated by a solid-line arrow of FIG. 4 and the state where the vibrating arms 28, 29, and 30 are bent in a direction indicated by a broken-line arrow of FIG. 4 are alternately repeated.

When this happens, the vibrating arms 28 and 29 produce a first force F1 to rotate the base portion 27 around an axis X1 parallel to the X axis (an axis in the longitudinal direction of the base portion 27). The vibrating arm 30 produces a second force F2 to rotate the base portion 27 around the axis X1 in the opposite direction to the first force F1.

The first force F1 and the second force F2 are in opposite directions and cancel each other in a region corresponding to a position where each of the vibrating arms 28, 29, and 30 is absent in the X-axis direction of the base portion 27 (between the vibrating arms 28 and 30 and between the vibrating arms 29 and 30).

As described above, two adjacent vibrating arms undergo bending vibration in opposite directions, reducing leakage vibration in a region corresponding to a position where each of the vibrating arms 28, 29, and 30 is absent in the X-axis direction of the base portion 27.

Meanwhile, in a region (in particular, the central portion in the width direction of each of the vibrating arms 28, 29, and 30) corresponding to a position where each of the vibrating arms 28, 29, and 30 is present in the X-axis direction of the base portion 27, the first force F1 and the second force F2 hardly cancel each other and vibrate the base portion 27 as leakage vibration.

As described above, in the vibrating member 2, the end portion of the linking portion 26 on the base portion 27 side is connected to a region corresponding to a position where each of the vibrating arms 28, 29, and 30 is absent in the X-axis direction of the base portion 27. For this reason, it is possible to prevent or suppress transmission of the above-described leakage vibration to the support portion 25.

In particular, the cutout 264, the hole 263, and the cutout 265 are formed between the base portion 27 and the support portion 25 to correspond to the positions where the vibrating arms 28, 29, and 30 are present in the X-axis direction, inhibiting leakage vibration from being transmitted to the support portion 25.

The linking portion 26 includes a plurality of linking beams (two linking beams) 261 and 262 described above, preventing vibration leakage and to allow the support portion 25 to stably support the base portion 27 and a plurality of vibrating arms 28, 29, and 30 through the linking portion 26.

When the width (average width) in the X-axis direction of each connection portion of the linking portion 26 and the base portion 27 is W1, and the distance between two adjacent vibrating arms 28 and 30 (the distance between the vibrating arms 29 and 30) is L1, it should suffice that the relationship $W1/L1 \leq 1$ is satisfied. Preferably, the relationship $0.5 \leq W1/L1 \leq 0.8$ is satisfied and, more preferably, the relationship $0.6 \leq W1/L1 \leq 0.8$ is satisfied. In other words, the distance in the X-axis direction between the linking beam 261 and the vibrating arm 28, the distance in the X-axis direction between the linking beam 261 and the vibrating arm 30, the distance in the X-axis direction between the linking beam 262 and the vibrating arm 29, and the distance in the X-axis direction between the linking beam 262 and the vibrating arm 30 are preferably 0.1 to 0.25 times the distance L1 and, more preferably, 0.1 to 0.2 times the distance L1. Therefore, it is possible to reliably prevent or suppress transmission of vibration of the base portion 27 associated with the bending vibration of the vibrating arms 28, 29, and 30 to the support portion 25.

In contrast, if W1/L1 is less than the lower limit value, it is difficult for the support portion 25 to stably support the base portion 27 and the three vibrating arms 28, 29, and 30 through the linking portion 26 depending on the shape, the cross-sectional area, the length in the Y-axis direction, and the like of the linking portion 26. Meanwhile, if W1/L1 exceeds the upper limit value, leakage vibration which is transmitted from the base portion 27 to the support portion 25 through the linking portion 26 tends to increase depending on the shape, the cross-sectional area, the length in the Y-axis direction, and the like of the linking portion 26.

When the thickness (average thickness) in the Z-axis direction (third direction) of the linking portion is D1, preferably, the relationship $0.5 \leq W1/D1 \leq 2$ is satisfied and, more preferably, the relationship $0.7 \leq W1/D1 \leq 2$ is satisfied. Therefore, even when the width W1 is narrowed, it is possible to prevent vibration leakage and to allow the support portion 25 to stably support the base portion 27 and a plurality of vibrating arms 28, 29, and 30 through the linking portion 26.

In contrast, if W1/D1 is less than the lower limit value, it is difficult for the support portion 25 to stably support the base portion 27 and the three vibrating arms 28, 29, and 30 through the linking portion 26 depending on the shape, the cross-sectional area, the length in the Y-axis direction, and the like of the linking portion 26. Meanwhile, if W1/D1 exceeds the upper limit value, leakage vibration which is transmitted from the base portion 27 to the support portion 25 through the linking portion 26 tends to increase depending on the shape, the cross-sectional area, the length in the Y-axis direction, and the like of the linking portion 26.

When the length in the Y-axis direction (second direction) of the linking portion 26 is L2, preferably, the relationship $0.5 \leq W1/L2 \leq 2$ is satisfied and, more preferably, the relationship $0.7 \leq W1/L2 \leq 2$ is satisfied. Therefore, even when the width W1 is narrowed, it is possible to prevent vibration leakage and to allow the support portion 25 to stably support the base portion 27 and the three vibrating arms 28, 29, and 30 through the linking portion 26.

In contrast, if W1/L2 is out of the range, depending on the shape, the cross-sectional area, the length in the Y-axis direction, and the like of the linking portion 26, the support portion 25 may not stably support the base portion 27 and the three vibrating arms 28, 29, and 30 through the linking portion 26, or leakage vibration which is transmitted from the base portion 27 to the support portion 25 through the linking portion 26 may increase.

In this embodiment, an example is described where the relationship W1/L2>1 is satisfied. When the relationship W1/L1>1 is satisfied, even when the width W1 is narrowed, it is possible to allow the support portion 25 to stably support the base portion 27 and a plurality of vibrating arms 28, 29, and 30 through the linking portion 26.

When the width (average width) in the Y-axis direction (second direction) of the base portion 27 is W2, preferably, the relationship $0.5 \leq W1/W2 \leq 2$ is satisfied and, more preferably, the relationship $0.6 \leq W1/W2 \leq 1.5$ is satisfied. Therefore, it is possible to prevent transmission of vibration of the base portion 27 associated with the bending vibration of the vibrating arms 28, 29, and 30 to the linking portion 26.

In contrast, if W1/W2 is less than the lower limit value, the width W2 is made too large, causing an increase of leakage vibration in a region corresponding to a position where each of the vibrating arms 28, 29, and 30 is absent in the X-axis direction of the base portion 27, or the width W1 is made too small, making it difficult for the support portion 25 to stably support the base portion 27 and the three vibrating arms 28, 29, and 30 through the linking portion 26. Meanwhile, if W1/W2 exceeds the upper limit value, the width W2 is made too small, making it very difficult for the base portion 27 to stably support the vibrating arms 28, 29, and 30, or the width W1 is made too large, such that the above-described relationship concerning W1/L1 may not be satisfied.

Package

Next, the package 3 will be described in which the vibrating member 2 is accommodated and fixed.

As shown in FIG. 1, the package 3 has a plate-shaped base plate 31, a frame-shaped frame member 32, and a plate-shaped cover member 33. The base plate 31, the frame member 32, and the cover member 33 are laminated in that order from the lower side to the upper side. The base plate 31 and the frame member 32, and the frame member 32 and the cover member 33 are bonded to each other through an adhesive, a soldering material, or the like. The package 3 accommodates the vibrating member 2 in an internal space S defined by the base plate 31, the frame member 32, and the cover member 33. Inside the package 3 may be accommodated an electronic component for driving the vibrating member 2 or the like, in addition to the vibrating member 2.

The material for the base plate 31 preferably has an insulation property (non-conductivity). Examples of the material for the base plate 31 include various types of glass, various types of ceramics materials, such as oxide ceramics, nitride ceramics, or carbide ceramics, various resin materials, such as polyimide, and the like.

Examples of the materials for the frame member 32 and the cover member 33 include the same material as the base plate 31, various metal materials, such as Al and Cu, various glass materials, and the like. In particular, when a light-transmissive material, such as a glass material, is used as the material for the cover member 33, a metal coated portion (not shown) may be formed in the vibrating member 2 in advance. When this happens, even after the vibrating member 2 has been accommodated in the package 3, laser is irradiated onto the metal coated portion through the cover member 33 and the metal coated portion is then removed to reduce the mass of the vibrating member 2 (by a mass reduction method), thereby performing the frequency adjustment of the vibrating member 2.

A pair of mount electrodes 35a and 35b are formed on the upper surface of the base plate 31 to be exposed in the internal space S. Epoxy-based or polyimide-based conductive adhesives 36a and 36b containing conductive particles are coated (piled) on the mount electrodes 35a and 35b, and the above-described vibrating member 2 is placed on the conductive adhesives 36a and 36b. Thus, the vibrating member 2 (support portion 25) is reliably fixed to the mount electrodes 35a and 35b (base plate 31).

At the time of the fixation, the vibrating member 2 is placed on the conductive adhesives 36a and 36b such that the conductive adhesive 36a comes into contact with the connection electrode 42 of the vibrating member 2 and the conductive adhesive 36b comes into contact with the connection electrode 41 of the vibrating member 2. Thus, the vibrating member 2 is fixed to the base plate 31 through the conductive adhesives 36a and 36b, the connection electrode 42 and the mount electrode 35a are electrically connected to each other through the conductive adhesive 36a, and the connection electrode 41 and the mount electrode 35b are electrically connected to each other through the conductive adhesive 36b.

Four external terminals 34a, 34b, 34c, and 34d are provided on the lower surface of the base plate 31.

Of the four external terminals 34a to 34d, the external terminals 34a and 34b are hot terminals which are respectively electrically connected to the mount electrodes 35a and 35b through conductor posts (not shown) which are provided in via holes formed in the base plate 31. The other two external terminals 34c and 34d are dummy terminals which are used to increase bonding strength and to uniformize the distance between the package 3 and a mounting board when the package 3 is mounted on the mounting board.

The mount electrodes 35a and 35b and the external terminals 34a to 34d may be formed through gold-plating on a tungsten and nickel-plated underlayer.

The mount electrodes 35a and 35b and the connection electrodes 41 and 42 are electrically connected to each other through, for example, metal wires (bonding wires) formed by a wire bonding technique. In this case, the vibrating member 2 can be fixed to the base plate 31 through a non-conductive adhesive, instead of the conductive adhesives 36a and 36b. When an electronic component is accommodated in the package 3, as necessary, write terminals may be formed on the lower surface of the base plate 31 to inspect the characteristics of the electronic component or to rewrite (adjust) various kinds of information (for example, temperature-compensated information of the vibrating device) in the electronic component.

According to the above-described first embodiment, the end portion of the linking portion 26 on the base portion 27 side is connected to a region corresponding to a position where each of the vibrating arms 28, 29, and 30 is absent in the X-axis direction of the base portion 27. Therefore, it is possible to prevent or suppress transmission of vibration of the base portion 27 associated with the bending vibration (out-of-plane bending vibration) of the vibrating arms 28, 29, and 30 to the support portion 25. As a result, it is possible to prevent vibration leakage and to increase the Q value.

Second Embodiment

Next, a second embodiment of the vibrating device according to the invention will be described.

Figure 5:
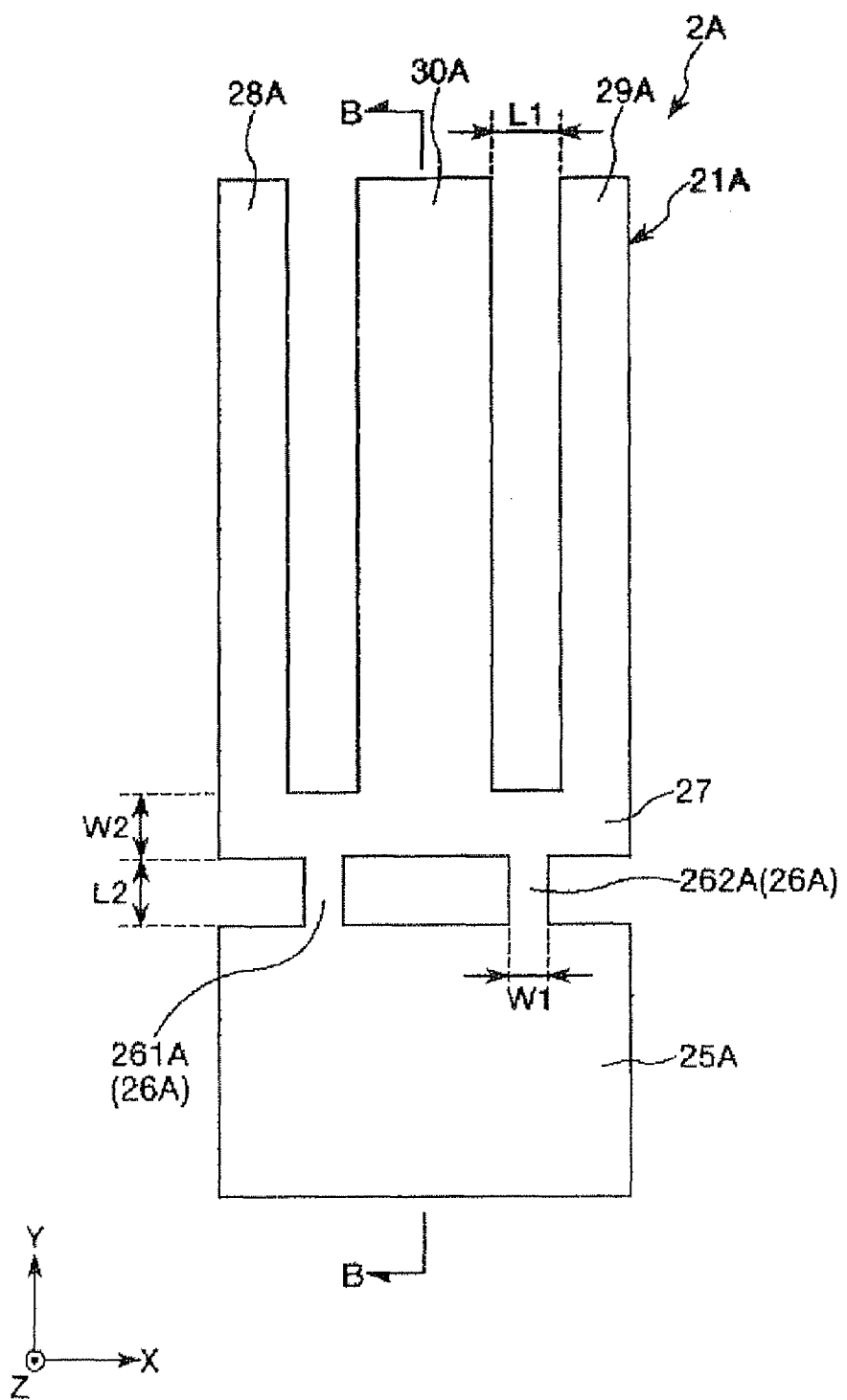
FIG. 5 is a top view showing a vibrating member in a vibrating device according to a second embodiment of the invention.
Figure 6:
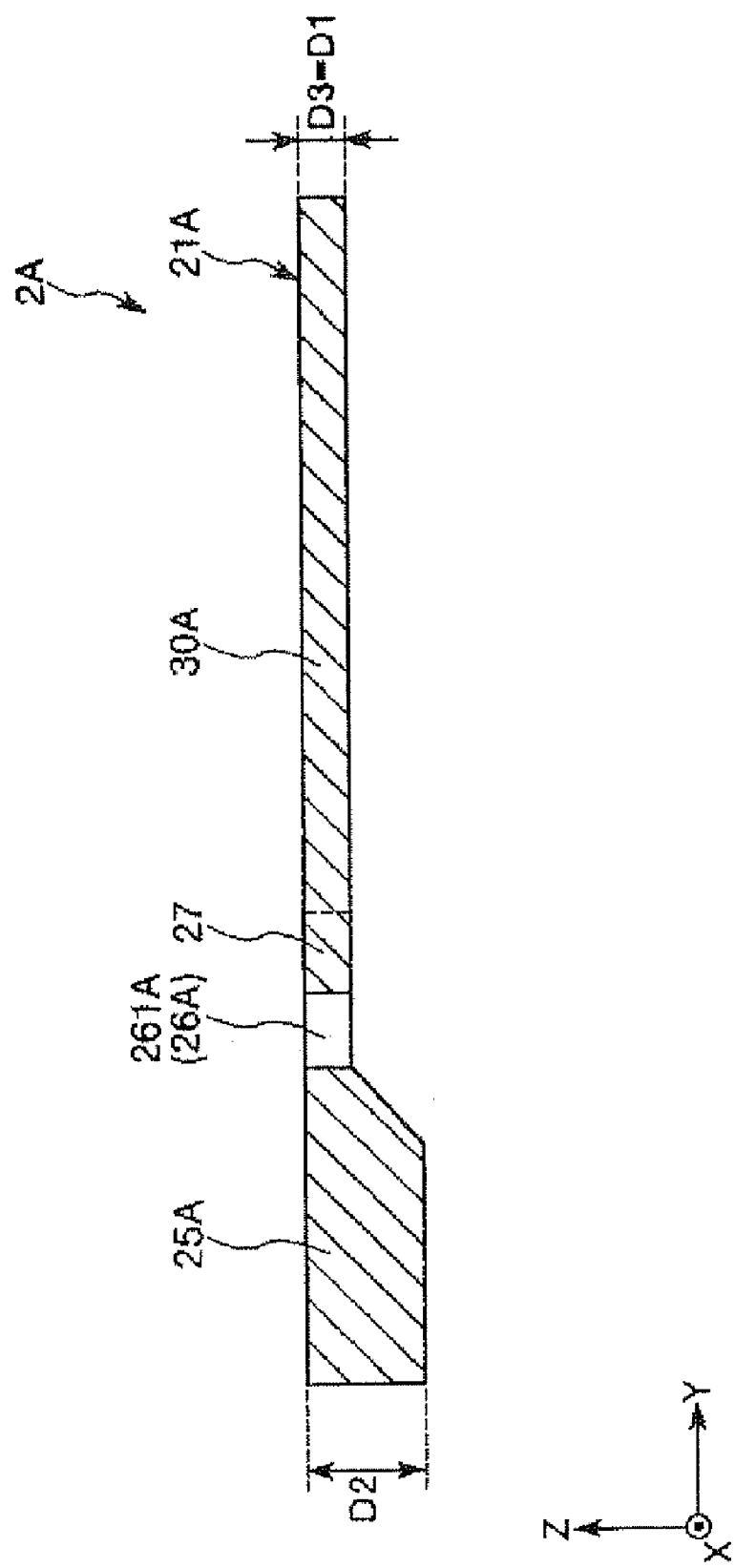
FIG. 6 is a sectional view taken along the line B-B of FIG. 5.

FIG. 5 is a top view showing a vibrating member in the vibrating device according to the second embodiment of the invention. FIG. 6 is a sectional view taken along the line B-B of FIG. 5.

Hereinafter, the vibrating device of the second embodiment will be described focusing on the differences from the above-described embodiment, and description of the same matters will be omitted.

The vibrating device of the second embodiment is substantially the same as in the first embodiment, except that the configuration of the linking portion and the support portion is different and the mass portions are not provided. In FIGS. 5 and 6, the same parts as those in the above-described embodiment are represented by the same reference numerals. In FIGS. 5 and 6, the piezoelectric element which vibrates each vibrating arm is not shown.

As shown in FIG. 5, a vibrating member 2A in the vibrating device of this embodiment has a vibrating substrate 21A.

The vibrating substrate 21A has a support portion 25A, a linking portion 26A, a base portion 27, and three vibrating arms 28A, 29A, and 30A.

The three vibrating arms 28A, 29A, and 30A are connected to one end of the base portion 27 in the width direction.

The three vibrating arms 28A, 29A, and 30A are the same as the three vibrating arms 28, 29, and 30 in the above-described first embodiment, except that the mass portions 281, 291, and 301 are not provided. Similarly to the vibrating arms 28, 29, and 30, a mass portion (hammer head) may be provided in the tip portion of each of the vibrating arms 28A, 29A, and 30A.

Meanwhile, the support portion 25A is connected to the other end of the base portion 27 in the width direction through the linking portion 26A.

The support portion 25A is the same as the support portion 25 in the above-described first embodiment, except that the thickness is different.

The thickness D2 of the support portion 25A is greater than the thickness D1 of the linking portion 26. Thus, it is possible to increase the mass of the support portion 25A. For this reason, even when the linking portion 26 vibrates somewhat, it is possible to prevent the support portion 25A from vibrating due to the vibration of the linking portion 26. As a result, it is possible to effectively prevent vibration leakage.

The thickness D1 of the linking portion 26A is equal to the thickness D3 of each of the base portion 27 and the vibrating arms 28A, 29A, and 30A.

The portion of the support portion 25A on the linking portion 26 side has a decreasing thickness toward the linking portion 26. The thickness of the support portion 25A may be constant (uniform) over the entire region.

The linking portion 26A is connected to the support portion 25A.

The linking portion 26A includes two linking beams 261A and 262A.

Each of the linking beams 261A and 262A has one end portion connected to the base portion 27 and the other end portion connected to the support portion 25A.

In particular, the one end portion of the linking beam 261A is connected to a corresponding portion between the vibrating arm 28A and the vibrating arm 30A in the X-axis direction (longitudinal direction) of the base portion 27. The one end portion of the linking beam 262A is connected to a corresponding portion between the vibrating arm 29A and the vibrating arm 30A in the X-axis direction (longitudinal direction) of the base portion 27. Here, the connection portions of the linking beams 261A and 262A and the base portion 27 constitute the connection portion of the linking portion 26A and the base portion 27.

In this way, the end portion of the linking portion 26A on the base portion 27 side is connected to a region corresponding to a position where each of the vibrating arms 28A, 29A, and 30A is absent in the X-axis direction (first direction) of the base portion 27. Therefore, it is possible to prevent or suppress transmission of leakage vibration of the base portion 27 to the support portion 25A.

In this embodiment, an example is described where, when the width in the X-axis direction of each connection portion of the linking portion 26A and the base portion 27 (in this embodiment, the width between the linking beams 261A and 262A) is W1 and the length of the linking portion 26A in the Y-axis direction (second direction) is L2, the relationship W1/L2<1 is satisfied. When the relationship W1/L2<1 is satisfied, the length L2 is extended, such that leakage vibration of the base portion is not easily transmitted to the support portion 25A through the linking portion 26A.

According to the above-described second embodiment, the same effects as in the above-described first embodiment can be obtained.

Third Embodiment

Next, a third embodiment of the vibrating device according to the invention will be described.

Figure 7:
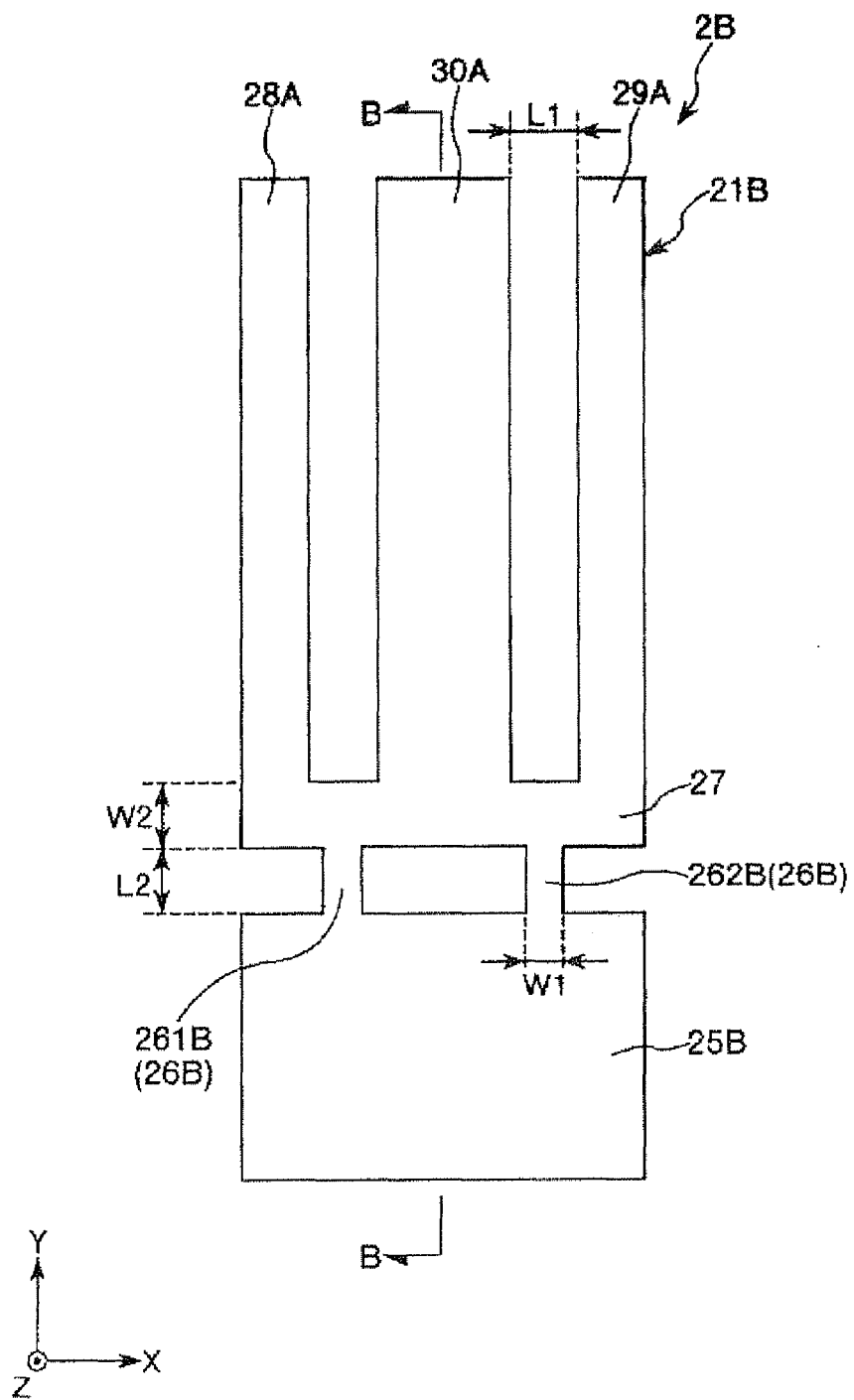
FIG. 7 is a top view showing a vibrating member in a vibrating device according to a third embodiment of the invention.
Figure 8:
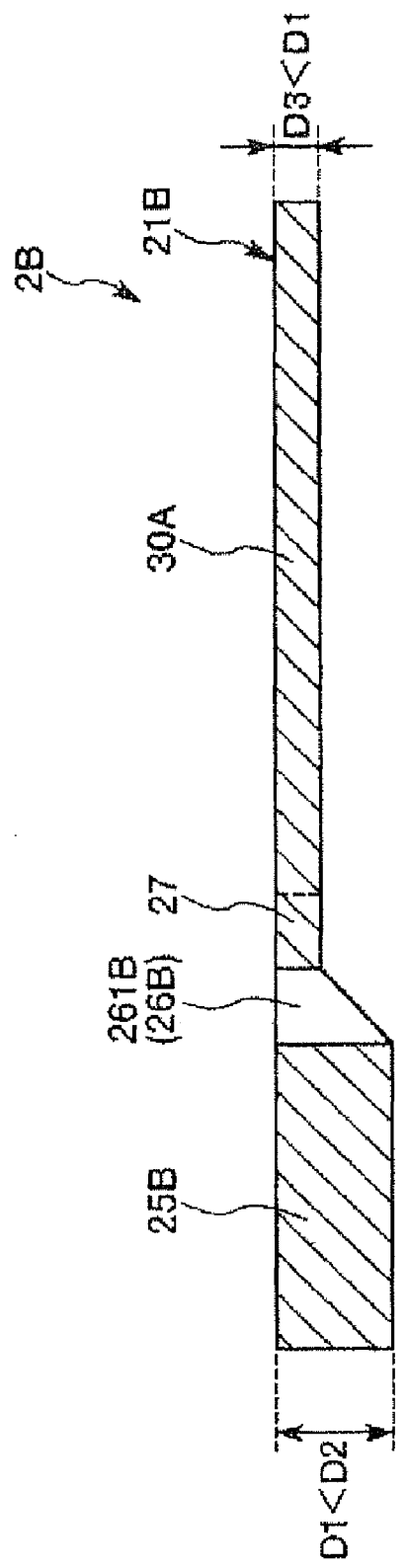
FIG. 8 is a sectional view taken along the line B-B of FIG. 7.

FIG. 7 is a top view showing a vibrating member in the vibrating device according to the third embodiment of the invention. FIG. 8 is a sectional view taken along the line B-B of FIG. 7.

Hereinafter, the vibrating device of the third embodiment will be described focusing on the differences from the above-described embodiments, and description of the same matters will be omitted.

The vibrating device of the third embodiment is substantially the same as in the first embodiment, except that the configuration of the linking portion and the support portion is different and the mass portions are not provided. The vibrating device of the third embodiment is substantially the same as in the second embodiment, except that the configuration of the linking portion and the support portion is different. In FIGS. 7 and 8, the same parts as those in the above-described embodiments are represented by the same reference numerals. In FIGS. 7 and 8, the piezoelectric element which vibrates each vibrating arm is not shown.

As shown in FIG. 7, a vibrating member 2B in the vibrating device of this embodiment has a vibrating substrate 21B.

The vibrating substrate 21B has a support portion 25B, a linking portion 26B, a base portion 27, and three vibrating arms 28A, 29A, and 30A.

The support portion 25B is connected to the base portion 27 through the linking portion 26B.

The support portion 25B is the same as the support portion 25 in the above-described first embodiment, except that the thickness is different. The support portion 25B is the same as the support portion 25A in the second embodiment, except that the thickness is constant over the entire region.

The linking portion 26B is connected to the support portion 25B.

The linking portion 26B includes two linking beams 261B and 262B.

Each of the linking beams 261B and 262B has one end portion connected to the base portion 27 and the other end portion connected to the support portion 25B.

In particular, the one end portion of the linking beam 261B is connected to a corresponding portion in the X-axis direction (longitudinal direction) of the base portion 27 between the vibrating arm 28A and the vibrating arm 30A. The one end portion of the linking beam 262B is connected to a corresponding portion in the X-axis direction (longitudinal direction) of the base portion 27 between the vibrating arm 29A and the vibrating arm 30A. Here, the connection portions of the linking beams 261B and 262B and the base portion 27 constitute the connection portion of the linking portion 26A and the base portion 27.

In this way, the end portion of the linking portion 26B on the base portion 27 side is connected to a region corresponding to a position where each of the vibrating arms 28A, 29A, and 30A is absent in the X-axis direction (first direction) of the base portion 27. Therefore, it is possible to prevent or suppress transmission of leakage vibration of the base portion 27 to the support portion 25B.

The thickness of each of the linking beams 261B and 262B (the thickness of the linking portion 26B) decreases from the support portion 25B toward the base portion 27. Therefore, it is possible to increase rigidity of the linking portion 26 and to effectively prevent leakage vibration of the base portion 27 from being transmitted to the support portion 25B through the linking portion 26B.

The thickness D1 of the linking portion 26B in the Z-axis direction is greater than the thickness D3 of each of the base portion 27 and the vibrating arms 28A, 29A, and 30A and smaller than the thickness D2 of the support portion 25B.

In this embodiment, an example is described where, when the width in the X-axis direction of each connection portion of the linking portion 26B and the base portion (in this embodiment, the width between the linking beams 261B and 262B) is W1 and the length of the linking portion 26B in the Y-axis direction (second direction) is L2, the relationship W1/L2<1 is satisfied.

According to the above-described third embodiment, the same effects as in the above-described first embodiment can be obtained.

Fourth Embodiment

Next, a fourth embodiment of the vibrating device according to the invention will be described.

Figure 9:
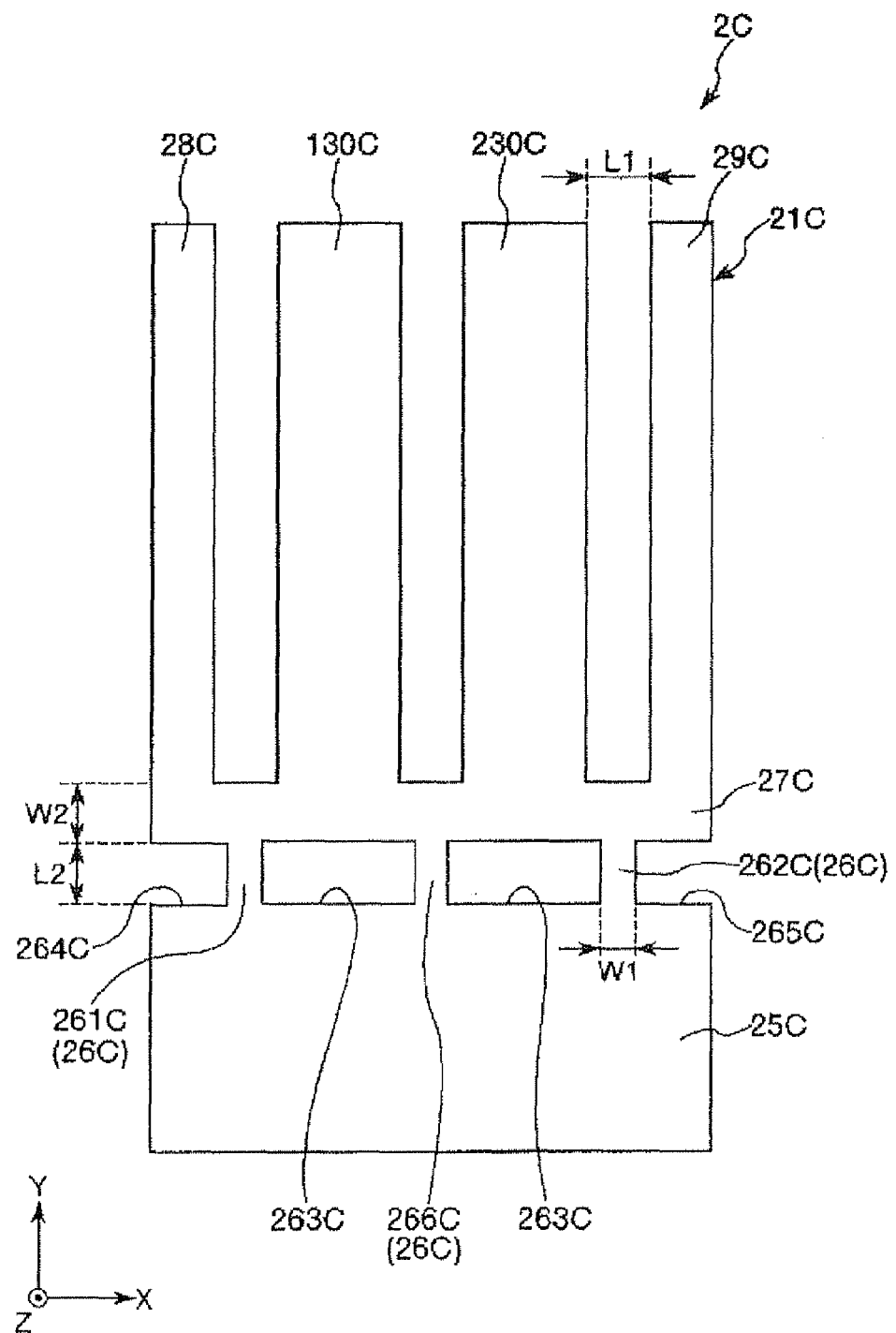
FIG. 9 is a top view showing a vibrating member in a vibrating device according to a fourth embodiment of the invention.

FIG. 9 is a top view showing a vibrating member in the vibrating device according to the fourth embodiment of the invention.

Hereinafter, the vibrating device of the fourth embodiment will be described focusing on the differences from the above-described embodiments, and description of the same matters will be omitted.

The vibrating device of the fourth embodiment is substantially the same as in the first to third embodiments, except that the number of linking portions and vibrating arms is different. In FIG. 9, the piezoelectric element which vibrates each vibrating arm is not shown.

As shown in FIG. 9, vibrating member 2C in the vibrating device of this embodiment has a vibrating substrate 21C.

The vibrating substrate 21C has a support portion 25C, a linking portion 26C, a base portion 27C, and four vibrating arms 28C, 29C, 130C, and 230C.

The four vibrating arms 28C, 29C, 130C, and 230C are connected to one end of the base portion 27C in the width direction.

Piezoelectric elements are respectively provided on the four vibrating arms 28C, 29C, 130C, and 230C. Electrical conduction is provided to the piezoelectric elements to cause bending vibration of the four vibrating arms 28C, 29C, 130C, and 230C in the Z-axis direction. At this time, the vibrating arms 28C and 230C undergo bending vibration in the same direction, and the vibrating arms 29C and 130C undergo bending vibration in the same direction but in the opposite direction to the vibrating arms 28C and 230C.

Meanwhile, the support portion 25C is connected to the other end of the base portion 27C in the width direction through the linking portion 26C.

The support portion 25C may be configured as in the above-described embodiment.

The linking portion 26C is connected to the support portion 25C.

The linking portion 26C includes three linking beams 261C, 262C, and 266C.

Each of the linking beams 261C, 262C, and 266C has one end portion connected to the base portion 27C and the other end portion connected to the support portion 25C.

In particular, the one end portion of the linking beam 261C is connected to a corresponding portion in the X-axis direction (longitudinal direction) of the base portion 27C between the vibrating arm 28C and the vibrating arm 130C. The one end portion of the linking beam 262C is connected to a corresponding portion in the X-axis direction (longitudinal direction) of the base portion 27C between the vibrating arm 29C and the vibrating arm 230C. The one end portion of the linking beam 266C is connected to a corresponding portion in the X-axis direction (longitudinal direction) of the base portion 27C between the vibrating arm 130C and the vibrating arm 230C. Here, the connection portions of the linking beams 261C, 262C, and 266C and the base portion constitute the connection portion of the linking portion 26A and the base portion 27.

In this way, the end portion of the linking portion 26C on the base portion 27C side is connected to a region corresponding to a position where each of the vibrating arms 28C, 29C, 130O, and 230C is absent in the X-axis direction (first direction) of the base portion 27C. Therefore, it is possible to prevent or suppress transmission of leakage vibration of the base portion 27C to the support portion 25C.

According to the above-described fourth embodiment, the same effects as in the above-described first embodiment can be obtained.

Fifth Embodiment

Next, a fifth embodiment of the vibrating device according to the invention will be described.

Figure 10:
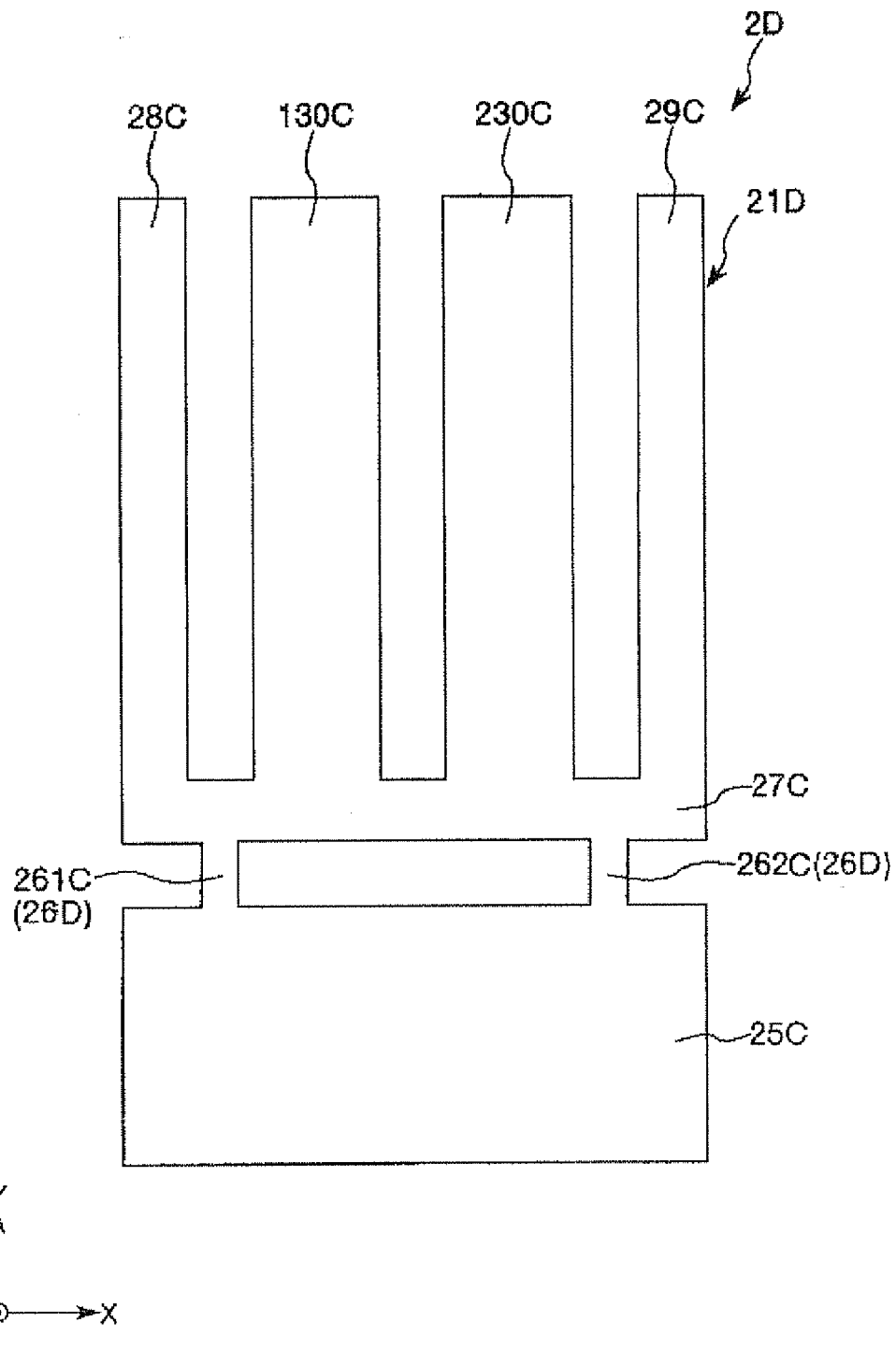
FIG. 10 is a top view showing a vibrating member in a vibrating device according to a fifth embodiment of the invention.

FIG. 10 is a top view showing a vibrating member in the vibrating device according to the fifth embodiment of the invention.

Hereinafter, the vibrating device of the fifth embodiment will be described focusing on the differences from the above-described embodiment, and description of the same matters will be omitted.

The vibrating device of the fifth embodiment is substantially the same as in the above-described fourth embodiment, except that the number of linking portions is different. In FIG.

10, the same parts as those in the above-described embodiments are represented by the same reference numerals. In FIG. 10, the piezoelectric element which vibrates each vibrating arm is not shown.

As shown in FIG. 10, a vibrating member 2D in the vibrating device of this embodiment has a vibrating substrate 21D.

The vibrating substrate 21D has a support portion 25C, a linking portion 26D, a base portion 27C, and four vibrating arms 28C, 29C, 130C, and 230C.

The linking portion 26D links the base portion 27C and the support portion 25C.

The linking portion 26C has two linking beams 261C and 262C.

According to the above-described fifth embodiment, the same effects as in the above-described first embodiment can be obtained.

Sixth Embodiment

Next, a sixth embodiment of the vibrating device according to the invention will be described.

Figure 11:
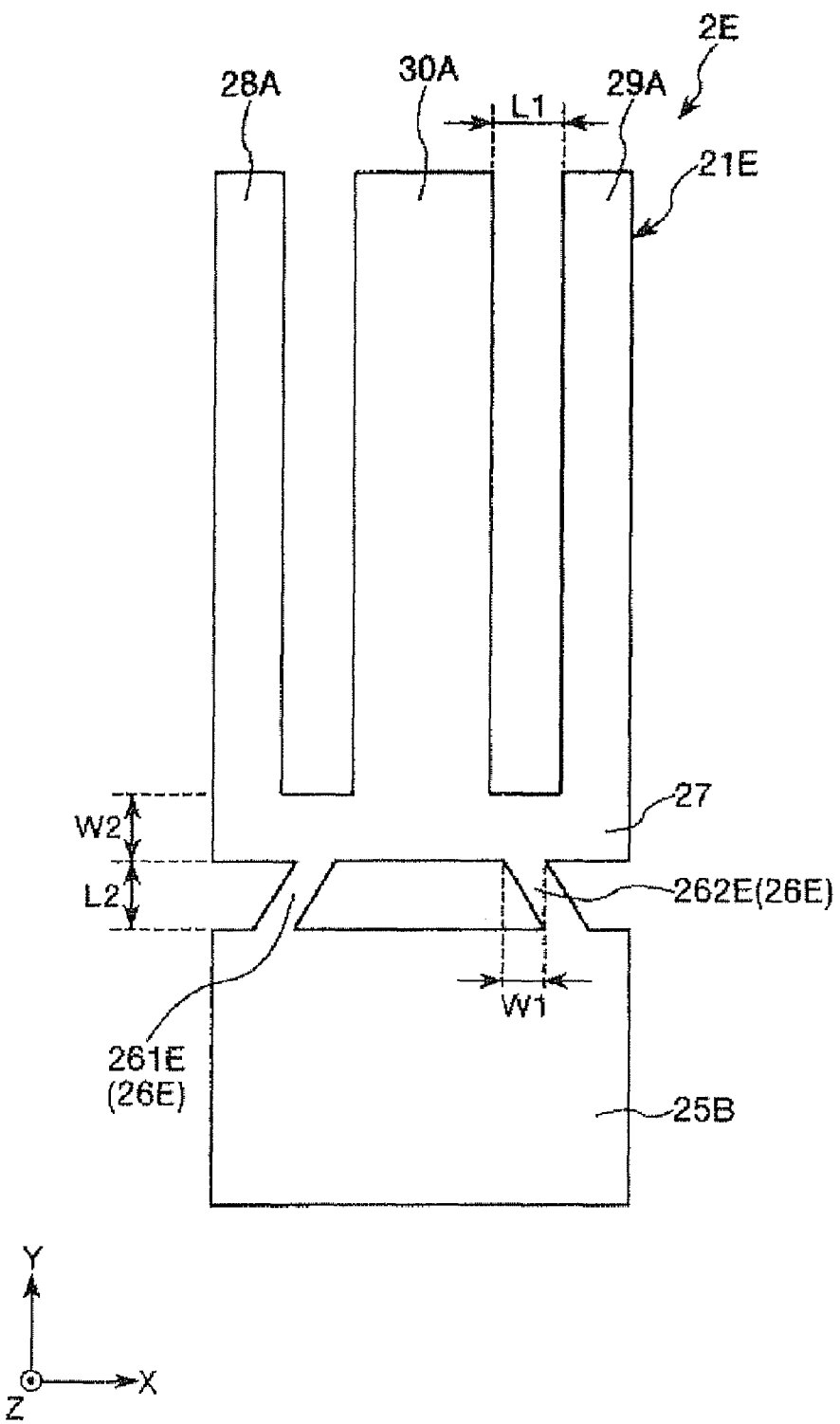
FIG. 11 is a top view showing a vibrating member in a vibrating device according to a sixth embodiment of the invention.

FIG. 11 is a top view showing a vibrating member in the vibrating device according to the sixth embodiment of the invention.

Hereinafter, the vibrating device of the sixth embodiment will be described focusing on the differences from the above-described embodiments, and description of the same matters will be omitted.

The vibrating device of the sixth embodiment is substantially the same as in the second or third embodiment, except that the configuration of the linking portion is different. In FIG. 11, the same parts as those in the above-described embodiments are represented by the same reference numerals. In FIG. 11, the piezoelectric element which vibrates each vibrating arm is not shown.

As shown in FIG. 11, a vibrating member 2E in the vibrating device of this embodiment has a vibrating substrate 21E.

The vibrating substrate 21E has a support portion 25B, a linking portion 26E, a base portion 27, and three vibrating arms 28A, 29A, and 30A.

The support portion 25B is connected to the base portion 27 through the linking portion 26E.

The linking portion 26E includes two linking beams 261E and 262E.

Each of the linking beams 261E and 262E has one end portion connected to the base portion 27 and the other end portion connected to the support portion 25B.

In particular, the one end portion of the linking beam 261E is connected to a corresponding portion in the X-axis direction (longitudinal direction) of the base portion 27 between the vibrating arm 28A and the vibrating arm 30A. The one end portion of the linking beam 262E is connected to a corresponding portion in the X-axis direction (longitudinal direction) of the base portion 27 between the vibrating arm 29A and the vibrating arm 30A. Here, the connection portions of the linking beams 261E and 262E and the base portion 27 constitute the connection portion of the linking portion 26E and the base portion 27.

In this way, the end portion of the linking portion 26E on the base portion 27 side is connected to a region corresponding to a position where each of the vibrating arms 28A, 29A, and 30A is absent in the X-axis direction (first direction) of the base portion 27. Therefore, it is possible to prevent or suppress transmission of leakage vibration of the base portion 27 to the support portion 25B.

The linking beams 261E and 262E are provided such that the distance therebetween increases from the base portion 27 toward the support portion 25B. Thus, the width of the linking portion 26E in the X-axis direction increases from the base portion 27 toward the support portion 25B. For this reason, the support portion 25B can stably support the base portion 27 and a plurality of vibrating arms 28A, 29A, and 30A through the linking portion 26E.

According to the above-described sixth embodiment, the same effects as in the above-described first embodiment can be obtained.

Seventh Embodiment

Next, a seventh embodiment of the vibrating device according to the invention will be described.

Figure 12:
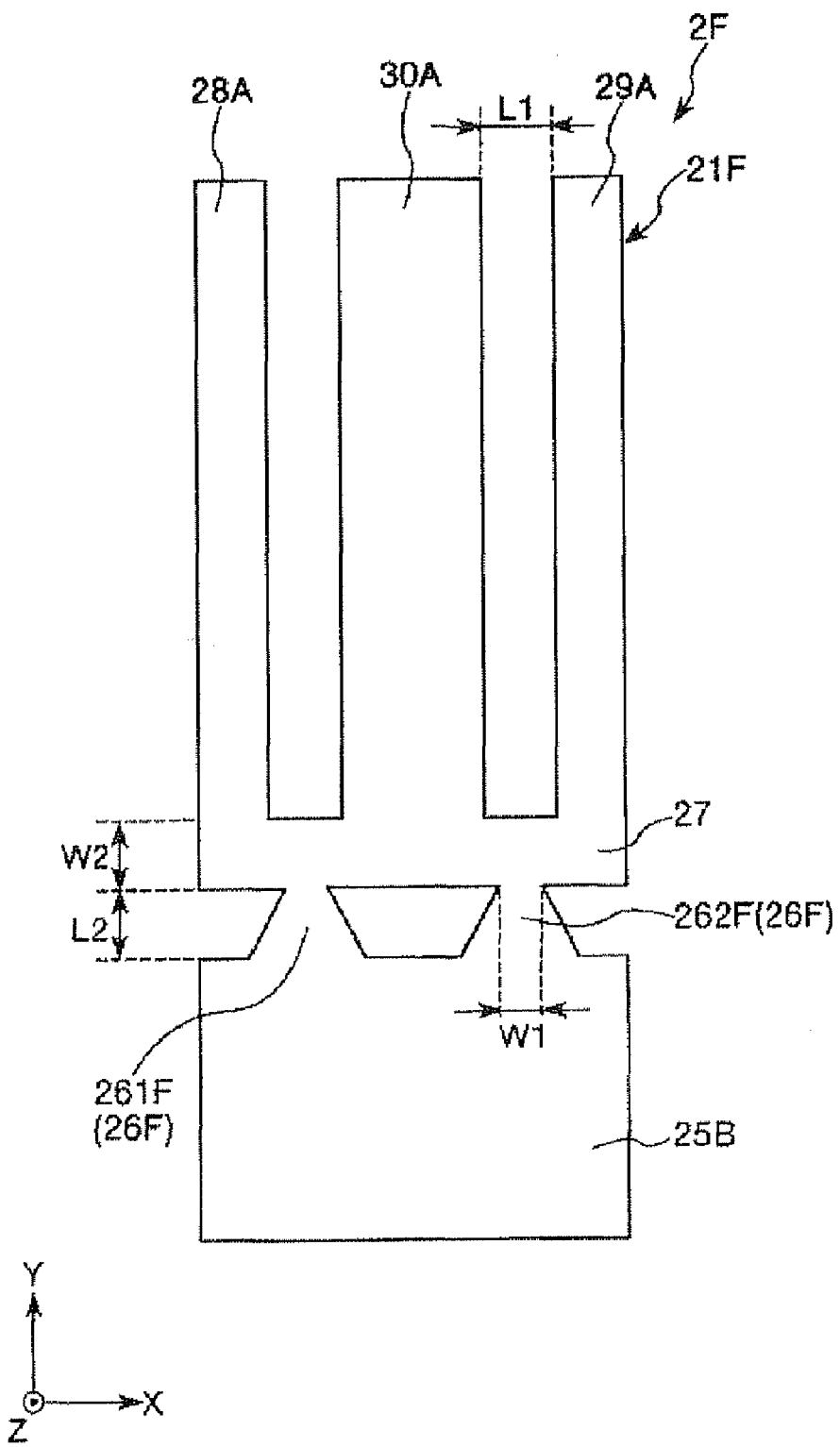
FIG. 12 is a top view showing a vibrating member in a vibrating device according to a seventh embodiment of the invention.

FIG. 12 is a top view showing a vibrating member in the vibrating device according to the seventh embodiment of the invention.

Hereinafter, the vibrating device of the seventh embodiment will be described focusing on the differences from the above-described embodiments, and description of the same matters will be omitted.

The vibrating device of the seventh embodiment is substantially the same as in the second or third embodiment, except that the configuration of the linking portion is different. In FIG. 12, the same parts as those in the above-described embodiments are represented by the same reference numerals. In FIG. 12, the piezoelectric element which vibrates each vibrating arm is not shown.

As shown in FIG. 12, a vibrating member 2F in the vibrating device of this embodiment has a vibrating substrate 21F.

The vibrating substrate 21F has a support portion 25B, a linking portion 26F, a base portion 27, and three vibrating arms 28A, 29A, and 30A.

The support portion 25B is connected to the base portion 27 through the linking portion 26F.

The linking portion 26F includes two linking beams 261F and 262F.

Each of the linking beams 261F and 262F has one end portion connected to the base portion 27 and the other end portion connected to the support portion 25B.

In particular, the one end portion of the linking beam 261F is connected to a corresponding portion in the X-axis direction (longitudinal direction) of the base portion 27 between the vibrating arm 28A and the vibrating arm 30A. The one end portion of the linking beam 262F is connected to a corresponding portion in the X-axis direction (longitudinal direction) of the base portion 27 between the vibrating arm 29A and the vibrating arm 30A. Here, the connection portions of the linking beams 261F and 262F and the base portion 27 constitute the connection portion of the linking portion 26F and the base portion 27.

In this way, the end portion of the linking portion 26F on the base portion 27 side is connected to a region corresponding to a position where each of the vibrating arms 28A, 29A, and 30A is absent in the X-axis direction (first direction) of the base portion 27. Therefore, it is possible to prevent or suppress transmission of leakage vibration of the base portion 27 to the support portion 25B.

Each of the linking beams 261F and 262F is provided to have an increasing width from the base portion 27 toward the support portion 25B. Thus, the support portion 25B can stably support the base portion 27 and a plurality of vibrating arms 28A, 29A, and 30A through the linking portion 26F. In particular, the width of the linking portion 26F in the X-axis direction increases from the base portion 27 toward the support portion 25B. For this reason, the support portion 25B can very stably support the base portion 27 and a plurality of vibrating arms 28A, 29A, and 30A through the linking portion 26F.

According to the above-described seventh embodiment, the same effects as in the above-described first embodiment can be obtained.

Eighth Embodiment

Figure 13A:
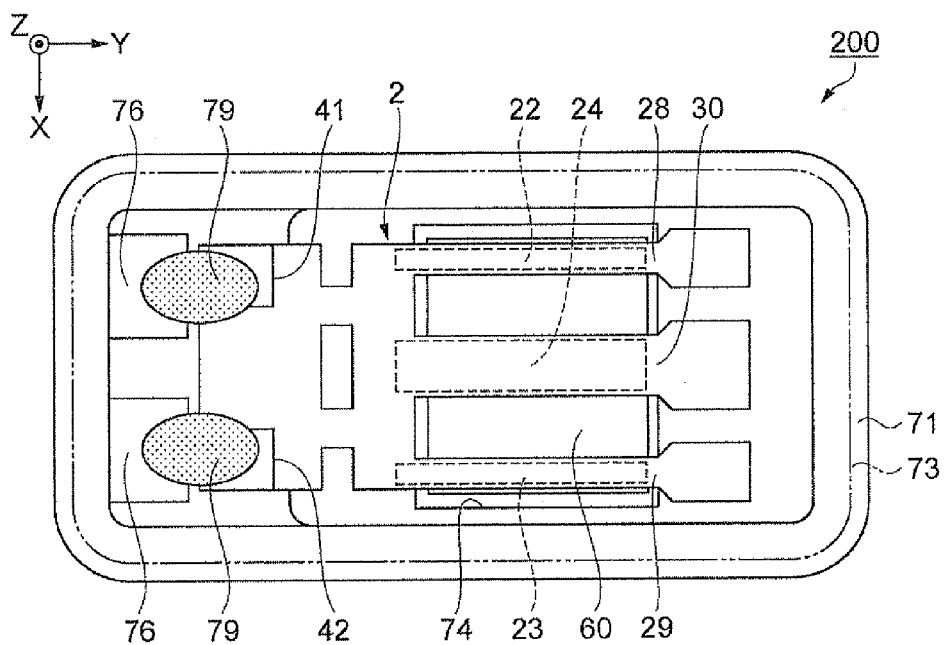
FIGS. 13A and 13B show the vibrating device according to an eighth embodiment of the invention, and specifically.
Figure 13B:
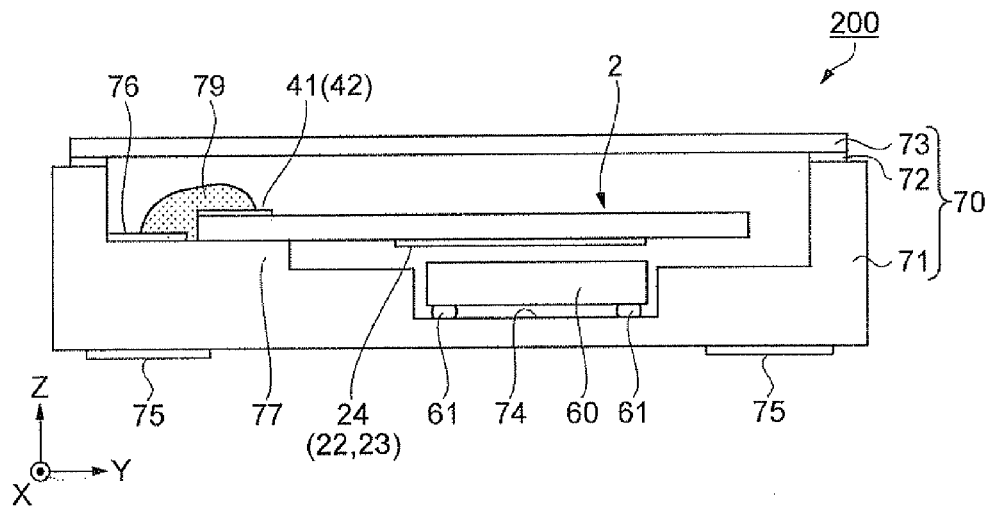

Next, an eighth embodiment of the vibrating device according to the invention will be described. FIGS. 13A and 13B show the vibrating device according to the eighth embodiment of the invention. FIG. 13A is a top view and FIG. 13B is a front sectional view of FIG. 13A.

Hereinafter, the vibrating device of the eighth embodiment will be described focusing on the differences from the above-described embodiments, and description of the same matters will be omitted.

The vibrating device of the eighth embodiment is substantially the same as in the above-described embodiments, except that a vibrating member and an IC chip are accommodated in the same package. In FIGS. 13A and 13B, the same parts as those in the above-described embodiments are represented by the same reference numerals.

vibrating device 200 shown in FIGS. 13A and 13B has a vibrating member 2, an IC chip 60 which serves as a circuit section having at least a function of oscillating the vibrating member 2, a package base 71 in which the vibrating member 2 and the IC chip 60 are accommodated, and a cover 73. In FIG. 13A, the cover 73 is not shown.

The vibrating member 2 is fixed such that the connection electrodes 41 and 42 of the vibrating member 2 are electrically connected to two vibrating member connection terminals 76 in a step portion 77 of the boxlike package base 71 having an opening on one side through conductive adhesives 79. The vibrating member 2 is configured such that the vibrating arms 28, 29, and 30 on which the piezoelectric elements 22, 23, and 24 are provided have free ends and supported in a cantilever manner.

The IC chip 60 is connected and bonded to electrodes (not shown) in a concave portion 74 at the bottom of the package base 71, and is connected to wiring lines, such as external connection terminals 75 or the vibrating member connection terminals 76. In this example, the IC chip 60 and the electrodes (not shown) are connected to each other through metal bumps 61.

The vibrating device 200 is configured such that the vibrating member 2 and the IC chip 60 are accommodated in a package 70 which is formed by bonding the package base 71 and the cover 73 using a seam ring 72 in a reduced-pressure state.

space in which the vibrating member 2, the IC chip 60, and the like are accommodated is not in the reduced-pressure atmosphere, but in an atmosphere filled with inert gas, such as nitrogen, helium, or argon.

The vibrating device 200 oscillates at a predetermined frequency when the vibrating member 2 is excited in response to a driving signal from an oscillation circuit of the IC chip 60.

Next, the package 70 will be described. The configuration and the materials of the electrodes and the like relating to the package base 71, the seam ring 72, and the cover 73 are the same as those described in the above-described first embodiment, thus detailed description thereof will be omitted.

The package 70 has the boxlike package base 71 having an opening on one side, the cover 73 which closes the opening of the package base 71, and the seam ring 72 which bonds the package base 71 and the cover 73. The step portion 77 on which the vibrating member 2 is placed is formed in the boxlike inside of the package base 71.

In the step portion 77 are formed the two vibrating member connection terminals 76 for connection to the connection electrodes 41 and 42 of the vibrating member 2, and the external connection terminals 75 which are provided in the peripheral portion of the package base 71 to be electrically connected to the vibrating member connection terminals 76 through wiring lines.

At the bottom of the package base 71 is provided the concave portion 74 in which the IC chip 60 is accommodated. Connection electrodes (not shown) are provided on the bottom surface of the concave portion 74.

The package base 71 and the cover 73 are formed of ceramic, and the seam ring 72 is formed of kovar alloy. The forming materials are not limited thereto.

The package 70 is configured such that the vibrating member 2 and the IC chip 60 are accommodated in the internal space defined by the package base 71, the seam ring 72, and the cover 73.

The vibrating member connection terminals 76 and the connection electrodes 41 and 42 may be electrically connected to each other through, for example, metal wires (bonding wires) formed by a wire bonding technique. In this case, the vibrating member 2 can be fixed to the step portion 77 of the package base 71 through a non-conductive adhesive, instead of the conductive adhesives 79.

Although in this example, a case has been described where the IC chip and the electrodes (not shown) are connected to each other through the metal bumps 61, the invention is not limited thereto. For example, connection may be made using metal wires (bonding wires) formed by a wire bonding technique.

When an electronic component is accommodated in the package 70, as necessary, write terminals may be formed on the lower surface of the package base 71 to inspect the characteristics of the electronic component or to rewrite (adjust) various kinds of information (for example, temperature-compensated information of the vibration device) in the electronic component.

According to the above-described eighth embodiment, the same effects as in the above-described first embodiment can be obtained. In addition, since the vibrating member 2 and the IC chip 60 having a function of oscillating the vibrating member 2 are accommodated in the single package 70, it is possible to increase space efficiency and it becomes possible to implement a small vibrating device.

Electronic Apparatus

The vibrating device of each embodiment described above can be applied to various electronic apparatuses, and a resultant electronic apparatus has high reliability.

Figure 14:
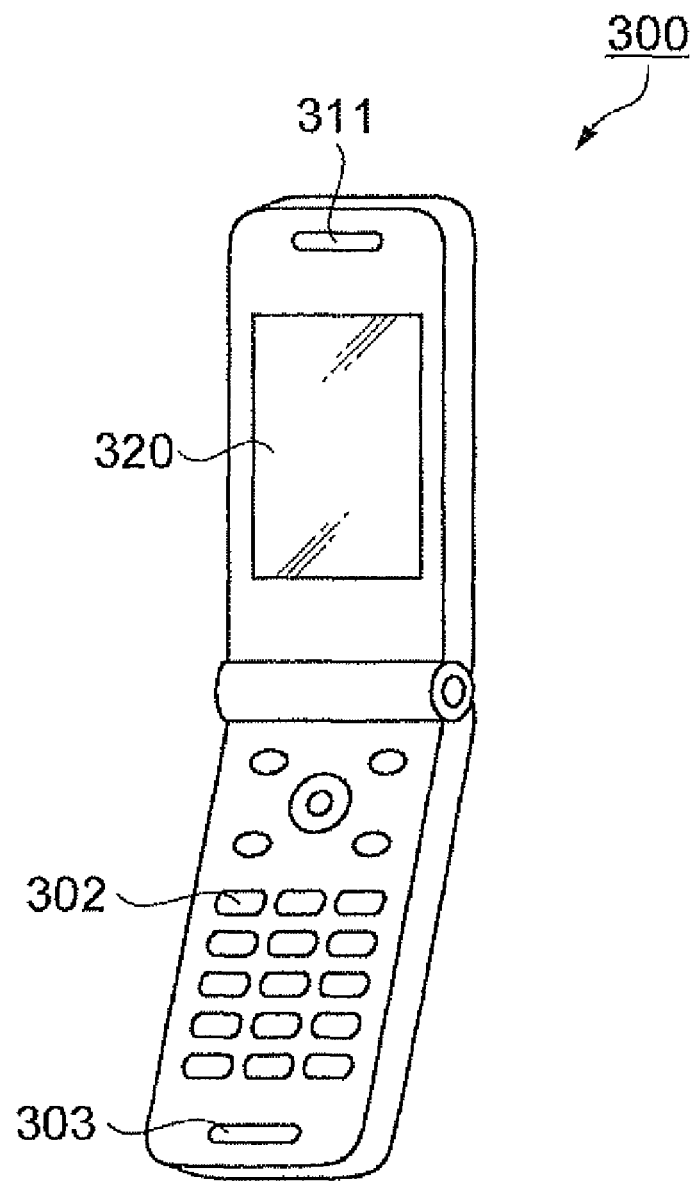
FIG. 14 is a perspective view showing the outline of a mobile phone which is an example of an electronic apparatus according to the invention.
Figure 15:
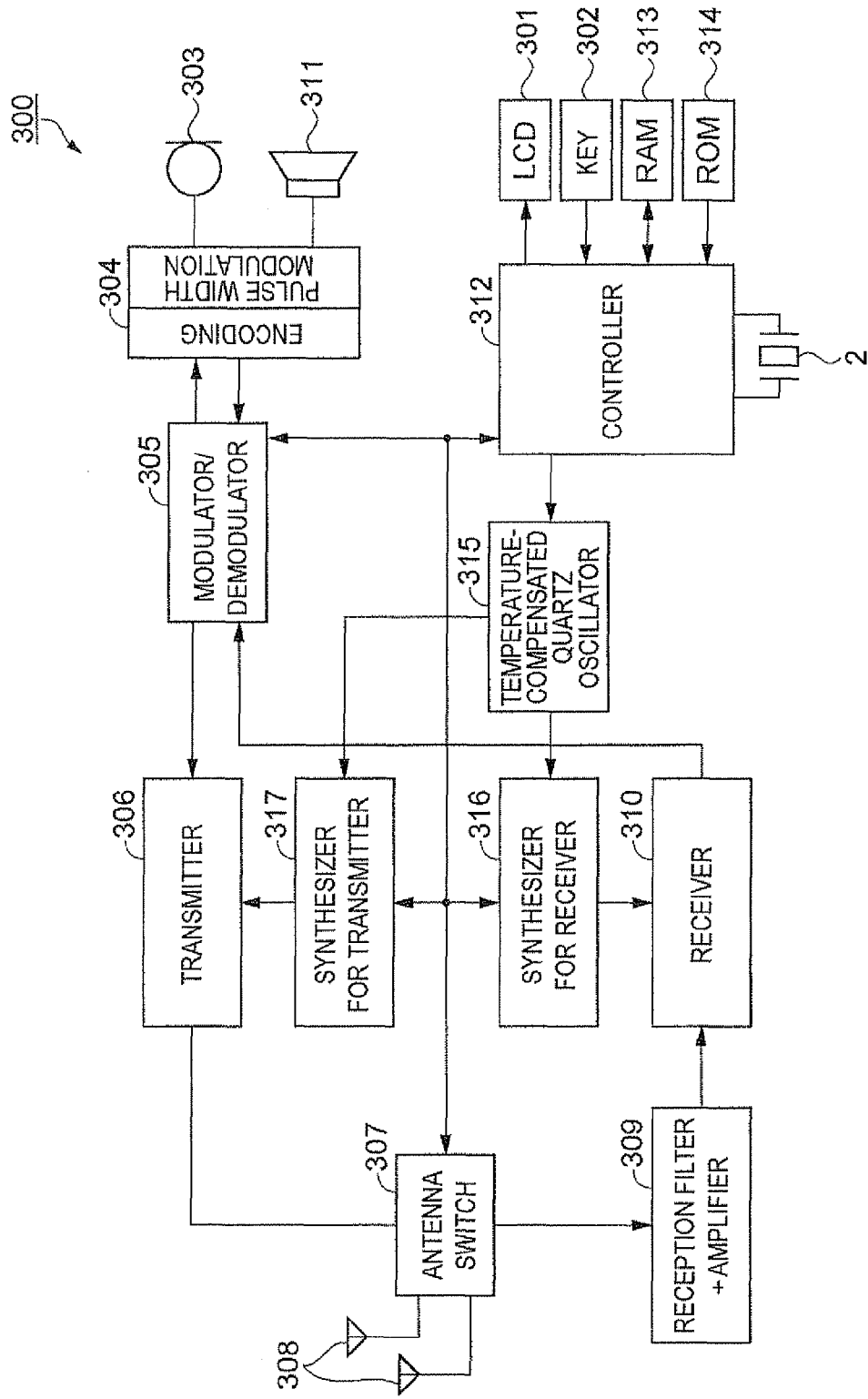
FIG. 15 is a circuit block diagram of the mobile phone which is an example of the electronic apparatus according to the invention.

FIGS. 14 and 15 show a mobile phone as an example of an electronic apparatus according to the invention. FIG. 14 is a perspective view showing the outline of the appearance of the mobile phone. FIG. 15 is a circuit block diagram of the mobile phone.

A mobile phone 300 uses the above-described vibrating device 2. Thus, description of the configuration and operation of the vibrating device 2 will be omitted with the use of the same reference numerals and the like.

As shown in FIG. 14, the mobile phone 300 is provided with an LCD (Liquid Crystal Display) 320 serving as a display section, keys 302 serving as an input section for inputting numerals and the like, a microphone 303, a speaker 311, and the like.

As shown in FIG. 15, at the time of transmission of the mobile phone 300, if a user inputs his/her voice to the microphone 303, signals pass through a pulse width modulation/encoding block 304 and a modulator/demodulator block 305 and are transmitted from an antenna 308 through a transmitter 306 and an antenna switch 307.

Meanwhile, signals transmitted from another person's phone are received by the antenna 308, pass through the antenna switch 307 and a reception filter 309, and are input to the modulator/demodulator block 305 through a receiver 310. The modulated or demodulated signals pass through the pulse width modulation/encoding block 305 and are output as voice to the speaker 311.

A controller 312 is provided to control the antenna switch 307, the modulator/demodulator block 305, and the like.

The controller 312 also controls the LCD 320 serving as a display section, the keys 302 serving as an input section for inputting numerals and the like, and a RAM 313 or a ROM 314, thus a high-precision controller is necessary. There is also a demand for reduction in the size of the mobile phone 300.

In order to meet such demand, the above-described vibrating device 2 is used.

The mobile phone 300 has other constituent blocks, such as a temperature-compensated quartz oscillator 315, a synthesizer 316 for a receiver, and a synthesizer 317 for a transmitter, but description thereof will be omitted.

In the vibrating device 2, it becomes possible to prevent or suppress transmission of vibration of the base portion 27 associated with the bending vibration (out-of-plane bending vibration) of the vibrating arms 28, 29, and 30 to the support portion 25. As a result, it is possible to prevent vibration leakage, to increase the Q value, and to stabilize variations between the vibrating member elements, achieving high precision. Therefore, the mobile phone 300 with the vibrating device 2 mounted therein can have stable characteristics and can realize reduction in size.

Figure 16:
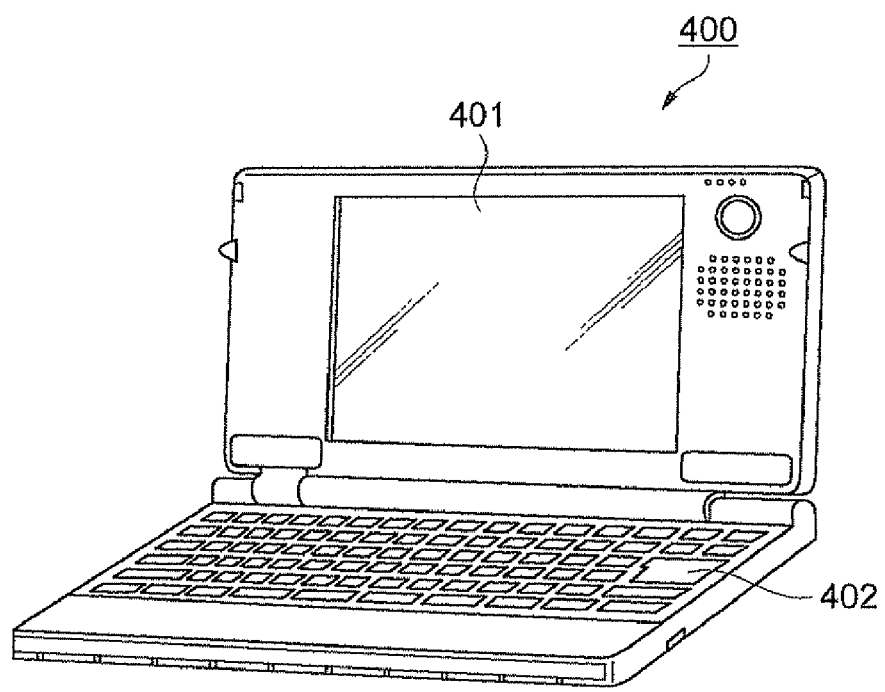
FIG. 16 is a perspective view showing the outline of a personal computer which is an example of the electronic apparatus according to the invention.

As the electronic apparatus including the vibrating device 2 of each embodiment described above, in addition to the above-described mobile phone 300, for example, a personal computer (mobile personal computer) 400 shown in FIG. 16 is exemplified. The personal computer 400 includes a display section 401, an input key section 402, and the like, and uses the above-described vibrating device 2 as the reference clock for electrical control.

As the electronic apparatus including the vibrating device 2, in addition to the above-described apparatuses, a mobile phone, a digital still camera, an ink jet ejecting apparatus (for example, an ink jet printer), a laptop personal computer, a television, a video camera, a video tape recorder, a car navigation system, a pager, an electronic organizer (including a communication function-equipped electronic organizer), an electronic dictionary, an electronic calculator, an electronic game machine, a word processor, a work station, a video phone, a security television monitor, an electronic binocular, a POS terminal, a medical instrument (for example, an electronic thermometer, a sphygmomanometer, a glucose meter, an electrocardiographic measurement apparatus, an ultrasonic diagnosis apparatus, or an electronic endoscope), a fish finder, various measurement apparatuses, meters (for example, meters of vehicle, aircraft, vessel), a flight simulator, or the like may be exemplified.

Although the vibrating member and the vibrating device according to the invention have been described on the basis of the embodiments shown in the drawings, the invention is not limited thereto. The configuration of each section can be substituted with an arbitrary configuration having the same function. Other arbitrary constituents may be added to the invention. The invention may be implemented by a combination of two or more arbitrary constituents (features) of the above-described embodiments.

For example, although in the above-described embodiments, an example has been described where the vibrating member has three or four vibrating arms, five or more vibrating arms may be provided.

Although in the above-described embodiments, an example has been described where the linking portion includes a plurality of linking beams, the invention is not limited thereto. For example, beams may be provided to link the linking beams. The number of connection portions of the end portion of the linking portion on the support portion side and the support portion may not be equal to the number of linking beams. For example, the end portions of the linking beams on the support portion side may be connected to each other.

The vibrating device of the invention may be applied to a gyro sensor and the like, in addition to a piezoelectric oscillator, such as a quartz oscillator (SPXO), a voltage-controlled quartz oscillator (VCXO), a temperature-compensated quartz oscillator (TCXO), or an oven-controlled quartz oscillator (OCXO).

The entire disclosure of Japanese Patent Application No. 2010-020945, filed Feb. 2, 2010 is expressly incorporated by reference herein.

What is claimed is:

1. A vibrating member comprising:
   a base portion;
   at least three vibrating arms which extend from one end portion of the base portion, are provided in parallel in a first direction, and extend in a second direction perpendicular to the first direction;
   at least two linking portions each of which is provided between the base end portions of two adjacent vibrating arms and extends from the other end portion of the base portion; and
   a support portion which is connected to the base portion through the linking portion,
   wherein a middle space is formed in the vibrating member between two linking portions, the space defined as an area surrounded by the two linking portions, the base portion, and the support portion;
   wherein at least two side spaces are formed in the vibrating member, the side spaces are aligned along the first direction with the middle space on opposing sides of the middle space, each side space is aligned along the second direction with at least one respective vibrating arm, each side space is partially surrounded by a single linking portion, the base portion, and the support portion, and each side space has one end open in the first direction.

2. The vibrating member according to claim 1,
   wherein at least two adjacent vibration arms undergo bending vibration in opposite directions.

3. The vibrating member according to claim 1,
   wherein one of a middle space and a side space is formed between the base portion and the support portion to correspond to a position in the first direction where each vibrating arm is present.

4. The vibrating member according to claim 1,
   wherein the linking portion includes a plurality of linking beams, one end portions of which are connected to the base portion and the other end portions of which are connected to the support portion.

5. The vibrating member according to claim 1,
wherein, when the width in the first direction of each connection portion of the linking portion and the base portion is W1 and the distance between two adjacent vibrating arms is L1, the relationship $0.5 \leq W1/L1 \leq 0.8$ is satisfied.

6. The vibrating member according to claim 5,
wherein, when the thickness of the linking portion in a third direction is D1, the relationship $0.5 \leq W1/D1 \leq 2$ is satisfied.

7. The vibrating member according to claim 5,
wherein, when the length of the linking portion in the second direction is L2, the relationship $0.5 \leq W1/L2 \leq 2$ is satisfied.

8. The vibrating member according to claim 5,
wherein, when the width of the base portion in the second direction is W2, the relationship $0.5 \leq W1/W2 \leq 2$ is satisfied.

9. The vibrating member according to claim 1,
wherein a mass portion having a cross-sectional area greater than that of the base end portion is provided at the tip portion of each vibrating arm.

10. The vibrating member according to claim 1,
wherein the vibrating arms are formed of a piezoelectric material.

11. The vibrating member according to claim 1,
wherein a piezoelectric element is provided on each vibrating arm, the piezoelectric element including a pair of electrode layers and a piezoelectric layer interposed between the pair of electrode layers.

12. A vibrating device comprising:
the vibrating member according to claim 1; and
a package in which the vibrating member is accommodated.

13. The vibrating device according to claim 12, further comprising:
a circuit section which drives the vibrating member.

14. An electronic apparatus comprising:
the vibrating member according to claim 1; and
a circuit section which drives the vibrating member.

15. An electronic apparatus comprising:
the vibrating device according to claim 12; and
a circuit section which drives the vibrating member.

16. The vibrating member according to claim 1,
wherein the middle space formed in the vibrating member between two linking portions is a through hole formed through the vibrating member.

17. The vibrating member according to claim 1,
wherein the middle space formed in the vibrating member between two linking portions is a concavity formed only partially through the vibrating member.

18. The vibrating member according to claim 1,
wherein at least one of the two side spaces formed in the vibrating member passes through the vibrating member in a Z-axis that is perpendicular to both the first and second directions.

19. The vibrating member according to claim 1,
wherein at least one of the two side spaces formed in the vibrating member is a concavity formed only partially through the vibrating member.

* * * * *